(12) United States Patent
Yang et al.

(10) Patent No.: US 7,414,549 B1
(45) Date of Patent: Aug. 19, 2008

(54) WYNER-ZIV CODING BASED ON TCQ AND LDPC CODES

(75) Inventors: Yang Yang, College Station, TX (US); Zixiang Xiong, Spring, TX (US)

(73) Assignee: The Texas A&M University System, College Station, TX (US)

( * ) Notice: Subject to any disclaimer, the term of this patent is extended or adjusted under 35 U.S.C. 154(b) by 0 days.

(21) Appl. No.: 11/499,601

(22) Filed: Aug. 4, 2006

(51) Int. Cl.
*H03M 7/00* (2006.01)

(52) U.S. Cl. ............................................. 341/50; 341/87

(58) Field of Classification Search ................. 341/50, 341/51, 87; 714/801
See application file for complete search history.

(56) References Cited

U.S. PATENT DOCUMENTS

| | | | |
|---|---|---|---|
| 2004/0194007 A1* | 9/2004 | Hocevar | 714/801 |
| 2006/0197690 A1* | 9/2006 | Liu et al. | 341/87 |
| 2007/0216545 A1* | 9/2007 | Li et al. | 341/50 |

OTHER PUBLICATIONS

S. Cheng and Z. Xiong, "Successive refinement for the Wyner-Ziv problem and layered code design," IEEE Trans. Signal Processing, vol. 53, pp. 3269-3281, Aug. 2005.
J. Chou, S. Pradhan, and K. Ramchandran, "Turbo and trellis-based constructions for source coding with side information," Proc. DCC'03, pp. 33-42, Snowbird, UT, Mar. 2003.
T. Cover and J. Thomas, Element of information theory, New York: Wiley, 1991, pp. 407-416, 438-444, month unknown.
J. Conway and J. Sloane, Sphere Packings. Lattices and Groups, Springer, New York, 1998, pp. 56-62, month unknown.
M. Eyuboglu and D. Forney, "Lattice and trellis quantization with lattice- and trellis-bounded codebooks-High-rate theory for memoryless sources," IEEE Trans. Inform. Theory, vol. 39, pp. 46-59, Jan. 1993.
Z. Liu, S. Cheng, A. Liveris, and Z. Xiong, "Slepian-Wolf coded nested lattice quantization for Wyner-Ziv coding: High-rate performance analysis and code design," Available at http://lena.tamu.edu/papers/SWCNQ.pdf (also in "Slepian-Wolf coded nested quantization (SWCNQ) for Wyner-Ziv coding: Performance analysis and code design", Proc. DCC'04, pp. 322-331, Snowbird, UT, Mar. 2004.).
A. Liveris, Z. Xiong and C. Georghiades, "Compression of binary sources with side information at the decoder using LDPC codes," IEEE Communications Letters, vol. 6, pp. 440-442, Oct. 2002.

(Continued)

*Primary Examiner*—Rexford Barnie
*Assistant Examiner*—Joseph Lauture

(57) ABSTRACT

An encoder employs a trellis coded quantization (TCQ) unit and a compression unit. The TCQ uses a set of polynomials that have been selected to maximize granular gain. The TCQ unit operates on a block of samples from a source. The compression unit compresses bit planes of the TCQ output, using parity check matrices of corresponding LDPC codes, to obtain corresponding syndromes. The parity check matrices are selected so their compression performance approaches close to the limit for Slepian-Wolf coding. A decoder employs a decoding unit and an estimation unit. The decoding unit decodes the syndromes using side information to produce an estimate for the TCQ output. The side information is correlated with the source. The estimation unit estimates the block of source samples using the estimated TCQ output and the side information. Trellis coded vector quantization may be used as an alternative to TCQ.

40 Claims, 14 Drawing Sheets

Block diagram of the proposed SWC-TCQ scheme.

OTHER PUBLICATIONS

M. Marcellin and T. Fischer, "Trellis coded quantization of memoryless and Gaussian-Markov sources," IEEE Trans. Communications, vol. 38, pp. 82-93, Jan. 1990.

M. Marcellin, "On entropy-constrained trellis coded quantization," IEEE Trans. Communications, vol. 42, pp. 14-16, Jan. 1994.

S. Pradhan and K. Ramchandran, "Distributed source coding using syndromes (DISCUS): Design and construction," IEEE Trans. Inform. Theory, vol. 49, pp. 626-643, Mar. 2003.

K. Price and R. Storn, "Differential evolution—A simple and efficient heuristic for global optimization over continuous spaces," J. Global Optimiz., vol. 11, pp. 341-359, 1997.

T. Richardson, M. Shokrollahi, and R. Urbanke, "Design of capacity-approaching irregular lowdensity parity-check codes", IEEE Trans. Inform. Theory, vol. 47, pp. 619-637, Feb. 2001.

D. Slepian and J. Wolf, "Noiseless coding of correlated information sources," IEEE Trans. Inform. Theory, vol. 19, pp. 471-480, Jul. 1973.

D. Taubman and M. Marcellin, JPEG2000: Image Compression Fundamentals, Standards, and Practice, Kluwer, 2001, pp. 128-142, month unknown.

G. Ungerboeck, "Channel coding with multilevel/phase signals," IEEE Trans. Inform. Theory, vol. 28, pp. 55-67, Jan. 1982.

G. Ungerboeck, "Trellis-coded modulation with redundant signal sets," IEEE Communications Magazine, vol. 25, pp. 5-21, Feb. 1987.

A. Wyner, "Recent results in the Shannon theory," IEEE Trans. Inform. Theory, pp. 2-10, Jan. 1974.

A. Wyner and J. Ziv, "The rate-distortion function for source coding with side information at the decoder," IEEE Trans. Inform. Theory, vol. 22, pp. 1-10, Jan. 1976.

A. Wyner, "The rate-distortion function for source coding with side information at the decoder-II: general sources," Inform. Contr., vol. 38, pp. 60-80, 1978, month unknown.

Z. Xiong, A. Liveris, and S. Cheng, "Distributed source coding for sensor networks," IEEE Signal Processing Magazine, vol. 21, pp. 80-94, Sep. 2004.

Y. Yang, S. Cheng, Z. Xiong, and W. Zhao, "Wyner-Ziv coding based on TCQ and LDPC codes," Proc. 37th Asilomar Conference on Signals, Systems, and Computers, pp. 825-829, Pacific Grove, CA, Nov. 2003.

R. Zamir and S. Shamai, "Nested linear/lattice codes for Wyner-Ziv encoding," Proc. ITW'98, pp. 92-93, Killarney, Ireland, Jun. 1998.

* cited by examiner

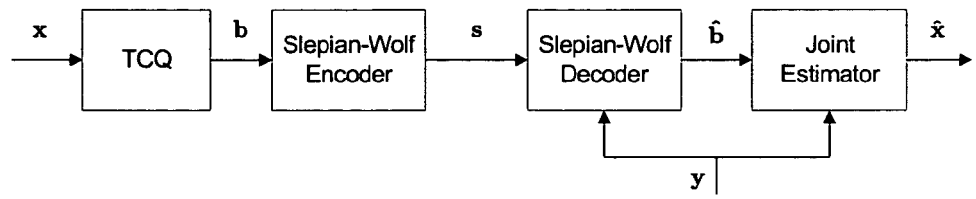
Fig. 2. SWC-TCQ for Wyner-Ziv coding of quadratic Gaussian sources.
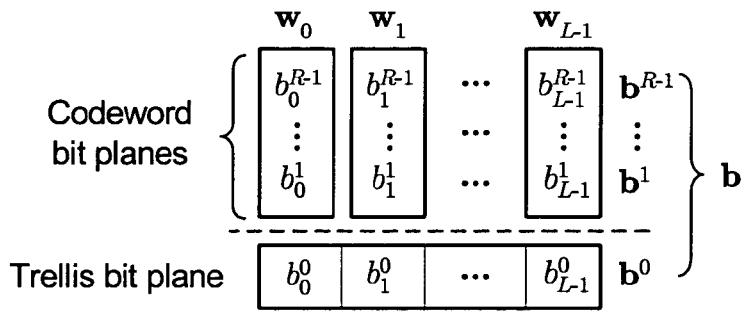
Fig. 3. The TCQ index vector $\mathbf{b} = \{b_0, b_1, \ldots, b_{L-1}\}$ decomposed into $R$ bit planes.
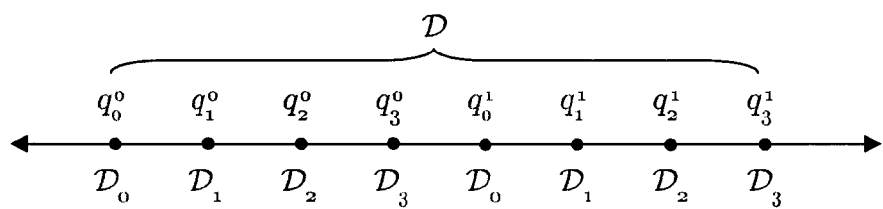
Fig. 4. An example of partitioning eight codewords into four cosets for a 2-bit TCQ.

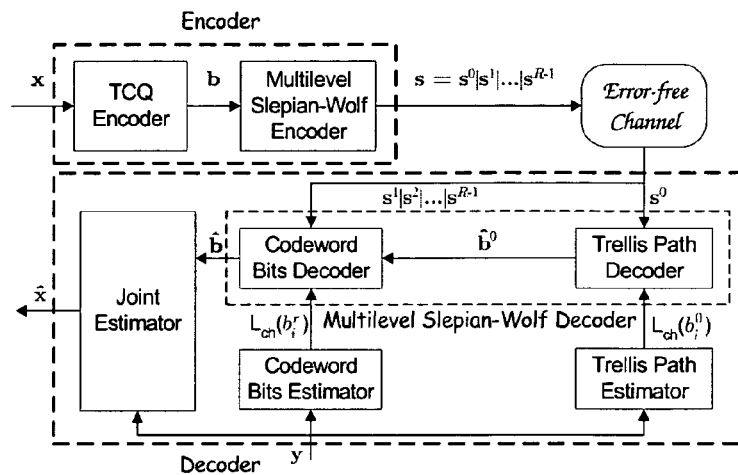
Fig. 5. Block diagram of the proposed SWC-TCQ scheme.
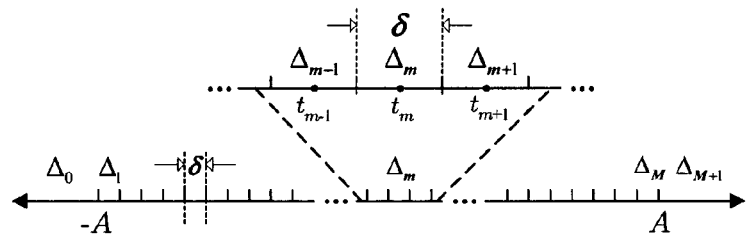
Fig. 6. Partition of the real line into $M+2$ mini-cells.
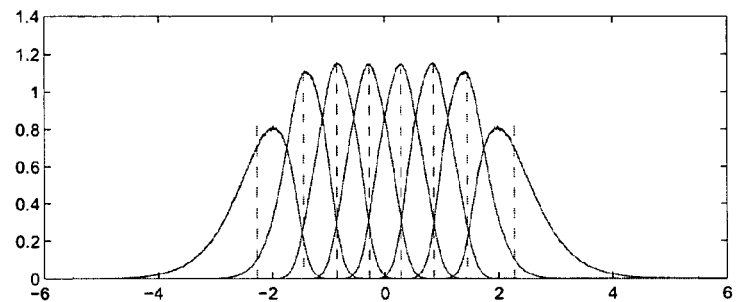
Fig. 7. $f(x|c,w)$ generated from the 2-bit TCQ shown in Fig. 4 with a quantization stepsize of $\lambda=0.575$ for $\sigma_X^2 = 1.28$. Dashed lines mark the centroids used in the quantizer decoder.

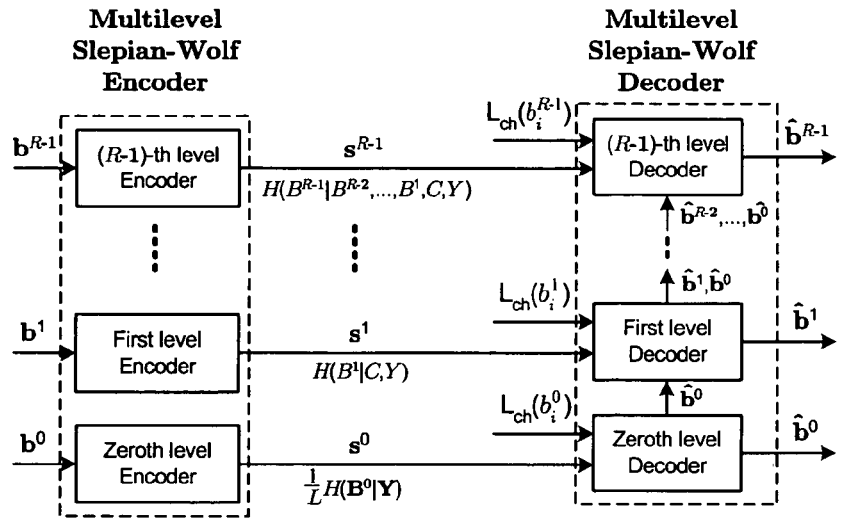
Fig. 8. Multilevel Slepian-Wolf coding.
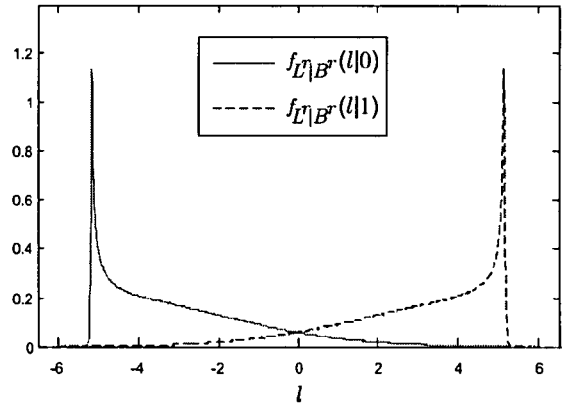
Fig. 9. The conditional PDFs for the hypothetical channel $B^r \to L^r$.
TABLE I
| TCVQ Dimension | # of States | Convolutional Code Rate | $h_3$ | $h_2$ | $h_1$ | $h_0$ | Granular Gain $g_{TCVQ}$ |
|---|---|---|---|---|---|---|---|
| $k = 2$ | 256 | 1/2 | - | - | 362 | 515 | 1.275 dB |
| $k = 4$ | 256 | 1/4 | 266 | 344 | 372 | 445 | 1.217 dB |
Fig. 10. Convolutional codes used in our TCVQ simulations and the resulting granular gains.

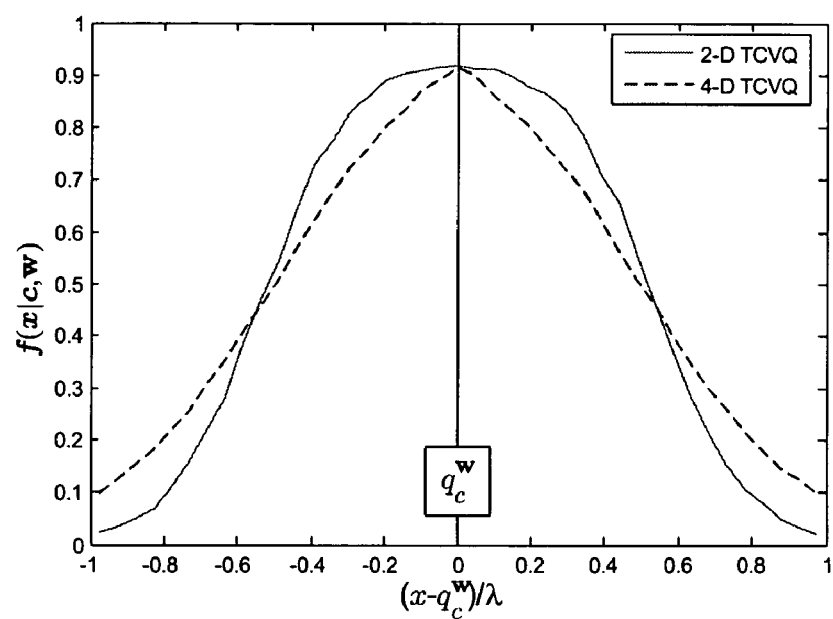
Fig. 11. Normalized conditional PDFs $f(x|c, \mathbf{w})$ for 2-D and 4-D TCVQ.

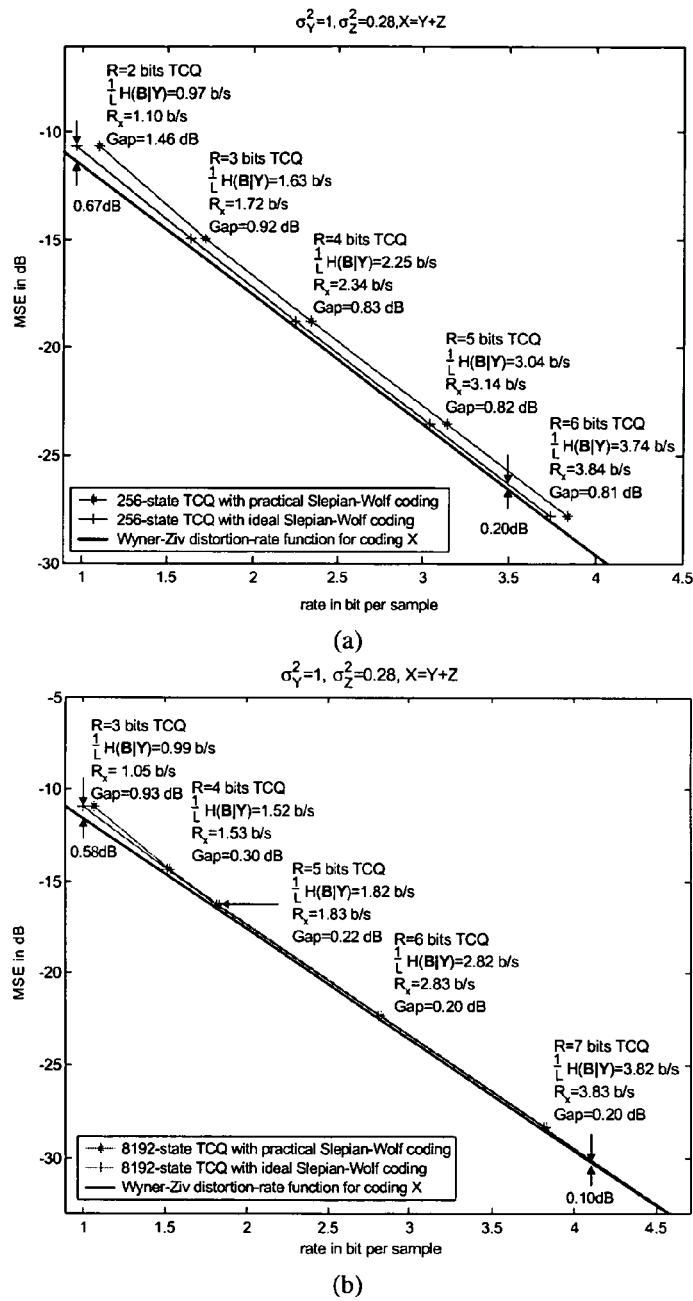

Fig. 12. SWC-TCQ. (a) Wyner-Ziv coding results based on 256-state TCQ and Slepian-Wolf coding. At high rate, ideal Slepian-Wolf coded TCQ performs 0.2 dB away from the theoretical limit. (b) Wyner-Ziv coding results based on 8,192-state TCQ and Slepian-Wolf coding. At high rate, ideal Slepian-Wolf coded TCQ performs 0.1 dB away from the theoretical limit. Results with practical Slepian-Wolf coding based on irregular LDPC codes are also included.

TABLE II

| # of States | $h_0$ | $h_1$ | Granular Gain $g_{TCQ}$ |
|---|---|---|---|
| 4 | 5 | 2 | 0.9962 dB |
| 8 | 13 | 4 | 1.0858 dB |
| 16 | 23 | 10 | 1.1562 dB |
| 32 | 43 | 24 | 1.2196 dB |
| 64 | 127 | 42 | 1.2698 dB |
| 128 | 233 | 156 | 1.3084 dB |
| 256 | 515 | 362 | 1.3352 dB |
| 512 | 1047 | 702 | 1.3662 dB |
| 1,024 | 2463 | 1022 | 1.3864 dB |
| 2,048 | 4261 | 3426 | 1.4035 dB |
| 4,096 | 11573 | 6376 | 1.4184 dB |
| 8,192 | 26637 | 10366 | 1.4284 dB |
| 16,384 | 40667 | 31216 | 1.4410 dB |
| 32,768 | 51372 | 103463 | 1.4476 dB |
| 65,536 | 155236 | 253603 | 1.4553 dB |

Fig. 13. Rate-$\frac{1}{2}$ convolutional codes (defined by octal form polynomials $h_0$ and $h_1$) used in our TCQ with different number of states.

TABLE III

| $N_s$ | $H(Q(X)\|Y)$ $= \frac{1}{L}H(B\|Y)$ | $R_X$ | $D_{WZ}(R_X)$ | $D(R_X)$ Linear Est. | $D(R_X)$ Non-linear Est. | Improvement |
|---|---|---|---|---|---|---|
| 256 | 0.97 b/s | 1.10 b/s | -12.12 dB | -10.44 dB | -10.66 dB | 0.22 dB |
|  | 2.24 b/s | 2.34 b/s | -19.59 dB | -18.74 dB | -18.77 dB | 0.03 dB |
| 8,192 | 0.98 b/s | 1.05 b/s | -11.82 dB | -10.54 dB | -10.73 dB | 0.19 dB |
|  | 1.82 b/s | 1.83 b/s | -16.52 dB | -16.29 dB | -16.30 dB | 0.01 dB |

Fig. 14. Comparison between optimal linear vs non-linear estimation at the SWC-TCQ decoder. The correlation model is $X = Y + Z$, with $Y \sim N(0,1)$ and $Z \sim N(0,0.28)$. The block length in TCQ is $L = 10^3$.

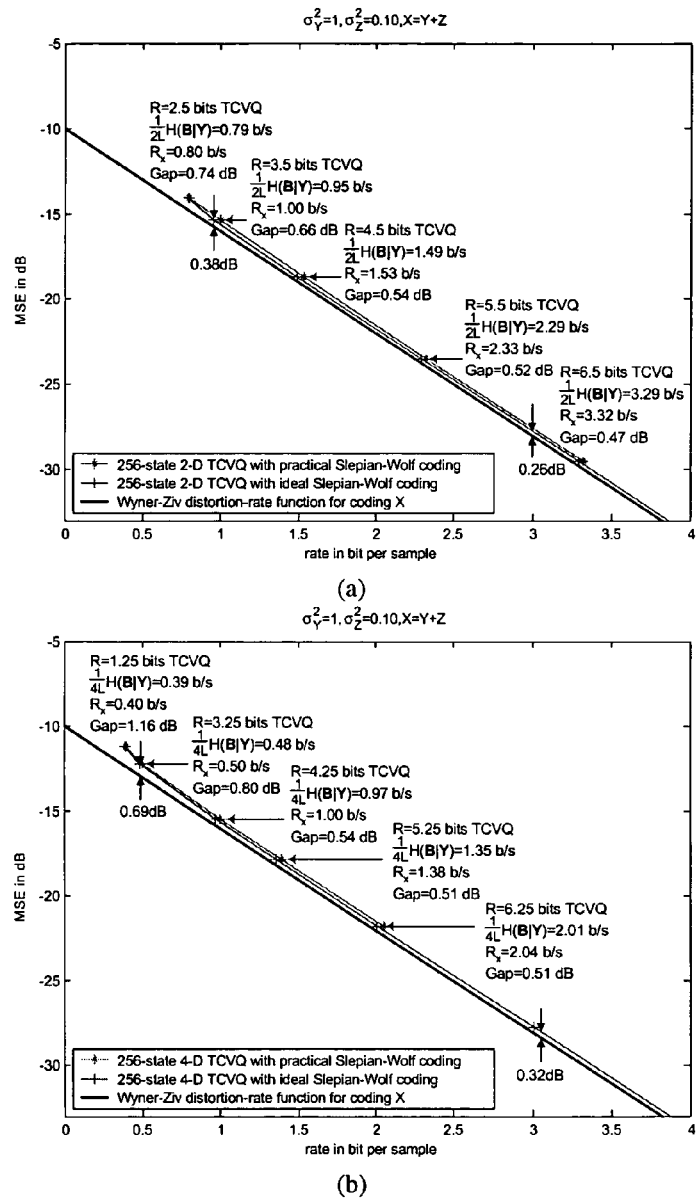
Fig. 15. SWC-TCVQ. (a) Wyner-Ziv coding results based on 2-D TCVQ and Slepian-Wolf coding. At high rate, ideal Slepian-Wolf coded TCVQ performs 0.26 dB away from the theoretical limit. (b) Wyner-Ziv coding results based on 4-D TCVQ and Slepian-Wolf coding. At high rate, ideal Slepian-Wolf coded TCVQ performs 0.32 dB away from the theoretical limit.

TABLE IV

| $k$ | $\frac{1}{kL}H(\mathbf{B}|\mathbf{Y})$ | $R_X$ | $D_{WZ}(R_X)$ | $D(R_X)$ Linear Est. | $D(R_X)$ Non-linear Est. | Improvement |
|---|---|---|---|---|---|---|
| 2 | 0.79 b/s | 0.80 b/s | -14.82 dB | -13.94 dB | -14.08 dB | 0.14 dB |
|   | 1.49 b/s | 1.53 b/s | -19.21 dB | -18.66 dB | -18.67 dB | 0.01 dB |
| 4 | 0.39 b/s | 0.40 b/s | -12.41 dB | -11.08 dB | -11.24 dB | 0.16 dB |
|   | 0.97 b/s | 1.00 b/s | -16.02 dB | -15.48 dB | -15.49 dB | 0.01 dB |

Fig. 16. Comparison between optimal linear vs non-linear estimation at the SWC-TCVQ decoder. The correlation model is $X = Y + Z$, with $Y \sim N(0,1)$ and $Z \sim N(0,0.1)$. The block length in TCVQ is $L = 10^3$ and the number of states is $N_s = 256$.

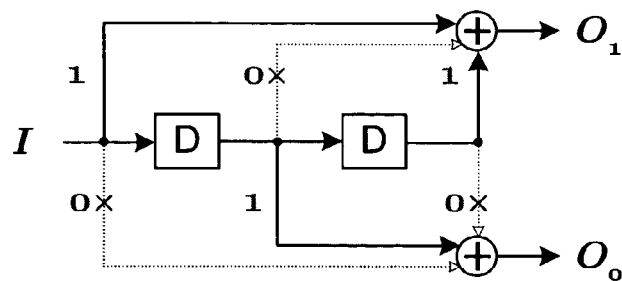

Fig. 17. Equivalent realization of the convolutional code $\mathcal{C}$ defined by $(h_0, h_1) = (5,2)_8$.

TABLE V

| # of States | $h_1$ | $h_0$ | $d_{free}^2/\alpha^2$ | $N_{d_{free}}$ | Granular Gain (dB) |
|---|---|---|---|---|---|
| 4 | 2 | 5 | 9 | 4 | 0.996 |
| 8 | 4 | 13 | 10 | 4 | 1.086 |
| 16 | 8 | 23 | 11 | 4 | 1.156 |
|  | (4) | (23) | (11) | (8) | (1.145) |
| 32 | 10 | 45 | 13 | 12 | 1.212 |
| 64 | 32 | 107 | 14 | 8 | 1.266 |
|  | (24) | (103) | (14) | (36) | (1.257) |
| 128 | 126 | 235 | 16 | 64 | 1.302 |
| 256 | 362 | 515 | 17 | 32 | 1.335 |
| 512 | 732 | 1063 | 18 | 44 | 1.364 |
|  | (342) | (1017) | (18) | (56) | (1.360) |
| 1,024 | 1162 | 2205 | 19 | 20 | 1.385 |
|  | (1536) | (2051) | (15) | (4) | (1.382) |
| 2,048 | 2056 | 4473 | 20 | 16 | 1.401 |
| 4,096 | 4016 | 12165 | 22 | 136 | 1.417 |
| 8,192 | 10366 | 26637 | 22 | 4 | 1.428 |

Fig. 18. Optimal pairs of polynomials that maximize $d_{free}$.

TABLE VI

|  | # of States | $h_1$ | $h_0$ | $j_{free}$ | $N_{15}$ | $N_{16}$ | $N_{17}$ | $N_{18}$ | $N_{19}$ | $N_{20}$ | $N_{21}$ | Granular Gain |
|---|---|---|---|---|---|---|---|---|---|---|---|---|
| $C_1$ | 256 | 242 | 625 | 15 | 4 | 8 | 4 | 44 | 168 | 192 | 420 | 1.343 dB |
| $C_2$ | 256 | 362 | 515 | 17 | 0 | 0 | 32 | 80 | 132 | 268 | 592 | 1.335 dB |

Fig. 19. Examples of $\rho(C)$ vs $g(\Lambda_{D,C})$.

TABLE VI

| # of States | $h_1$ | $h_0$ | $j_{free}(j^{max})$ | $M_{j^{max}}$ | Granular Gain (dB) | Better? |
|---|---|---|---|---|---|---|
| 4 | 2 | 5 | 9 (9) | 4 | 0.996 | Same |
| 8 | 4 | 13 | 10 (10) | 4 | 1.086 | Same |
| 16 | 8 | 23 | 11 (11) | 4 | 1.156 | Same |
| 32 | 24 | 43 | 12 (13) | 8 | 1.220 | Better |
| 64 | 42 | 127 | 12 (14) | 20 | 1.270 | Better |
| 128 | 156 | 233 | 14 (16) | 24 | 1.308 | Better |
| 256 | 242 | 625 | 15 (17) | 16 | 1.343 | Better |
| 512 | 702 | 1047 | 16 (18) | 36 | 1.366 | Better |
| 1,024 | 1022 | 2463 | 17 (19) | 36 | 1.386 | Better |
| 2,048 | 3426 | 4261 | 20 (20) | 72 | 1.403 | Better |
| 4,096 | 6376 | 11573 | 21 (22) | 84 | 1.418 | Better |

Fig. 20. Optimal polynomials found by the "list and simulate" method.

TABLE VII

| Criterion | $h_1$ | $h_0$ | $j_{free}$ | $N_{12}$ | $N_{13}$ | $N_{14}$ | $N_{15}$ | $N_{16}$ | Granular Gain $g_{TCVQ}$ |
|---|---|---|---|---|---|---|---|---|---|
| Min $d_{free}$ | 302 | 457 | 12 | 72 | 96 | 248 | 444 | 1724 | 1.278 dB |
| Max $g_{TCVQ}$ | 336 | 463 | 12 | 92 | 0 | 436 | 0 | 3332 | 1.280 dB |

Fig. 21. Optimized 256-state convolutional codes using different criterions.

TABLE VIII

| $B^3$ | | $B^4$ | | $B^5$ | |
|---|---|---|---|---|---|
| $\lambda_2$ | 0.233548 | $\lambda_2$ | 0.051531 | $\lambda_2$ | 0.097368 |
| $\lambda_3$ | 0.194646 | $\lambda_3$ | 0.345946 | $\lambda_3$ | 0.247449 |
| $\lambda_6$ | 0.046378 | $\lambda_9$ | 0.163593 | $\lambda_6$ | 0.009312 |
| $\lambda_7$ | 0.134776 | $\lambda_{13}$ | 0.006506 | $\lambda_8$ | 0.286397 |
| $\lambda_9$ | 0.000809 | $\lambda_{14}$ | 0.083198 | $\lambda_{20}$ | 0.033939 |
| $\lambda_{10}$ | 0.000857 | $\lambda_{18}$ | 0.060269 | $\lambda_{21}$ | 0.015611 |
| $\lambda_{12}$ | 0.008823 | $\lambda_{19}$ | 0.030076 | $\lambda_{22}$ | 0.008987 |
| $\lambda_{13}$ | 0.004434 | $\lambda_{24}$ | 0.033886 | $\lambda_{23}$ | 0.133864 |
| $\lambda_{14}$ | 0.073720 | $\lambda_{25}$ | 0.060927 | $\lambda_{35}$ | 0.135566 |
| $\lambda_{15}$ | 0.008073 | $\lambda_{39}$ | 0.081269 | $\lambda_{41}$ | 0.021583 |
| $\lambda_{27}$ | 0.073939 | $\lambda_{40}$ | 0.030878 | $\lambda_{43}$ | 0.009924 |
| $\lambda_{28}$ | 0.045439 | $\lambda_{42}$ | 0.049914 | | |
| $\lambda_{30}$ | 0.005366 | $\lambda_{43}$ | 0.002007 | | |
| $\lambda_{31}$ | 0.013022 | | | | |
| $\lambda_{99}$ | 0.052884 | | | | |
| $\lambda_{100}$ | 0.103286 | | | | |
| $\rho_6$ | 1.000000 | $\rho_{70}$ | 1.000000 | $\rho_{5500}$ | 1.000000 |
| Rate | 0.2500 b/s | Rate | 0.9200 b/s | Rate | 0.9990 b/s |
| Capacity | 0.2582 b/s | Capacity | 0.9258 b/s | Capacity | 0.9999 b/s |
| Loss | 0.0082 b/s | Loss | 0.0058 b/s | Loss | 0.0009 b/s |

Fig. 22. Optimized LDPC degree profiles for SWC-TCQ with 8,192-state TCQ. $\sigma_Y^2 = 1, \sigma_Z^2 = 0.28, X = Y + Z$; TCQ rate $R = 7$ b/s, step size $= 0.0782$.

TABLE IX

| $B^2$ | | $B^3$ | | $B^4$ | |
|---|---|---|---|---|---|
| $\lambda_2$ | 0.221504 | $\lambda_2$ | 0.120164 | $\lambda_2$ | 0.097368 |
| $\lambda_3$ | 0.204720 | $\lambda_3$ | 0.206774 | $\lambda_3$ | 0.247449 |
| $\lambda_4$ | 0.002956 | $\lambda_5$ | 0.078885 | $\lambda_6$ | 0.009312 |
| $\lambda_5$ | 0.002378 | $\lambda_6$ | 0.082927 | $\lambda_8$ | 0.286397 |
| $\lambda_7$ | 0.100413 | $\lambda_7$ | 0.001027 | $\lambda_{20}$ | 0.033939 |
| $\lambda_8$ | 0.097671 | $\lambda_8$ | 0.004145 | $\lambda_{21}$ | 0.015611 |
| $\lambda_9$ | 0.009632 | $\lambda_9$ | 0.015749 | $\lambda_{22}$ | 0.008987 |
| $\lambda_{15}$ | 0.001707 | $\lambda_{10}$ | 0.107056 | $\lambda_{23}$ | 0.133864 |
| $\lambda_{16}$ | 0.008666 | $\lambda_{12}$ | 0.030397 | $\lambda_{35}$ | 0.135566 |
| $\lambda_{18}$ | 0.113425 | $\lambda_{13}$ | 0.112150 | $\lambda_{41}$ | 0.021583 |
| $\lambda_{19}$ | 0.003631 | $\lambda_{26}$ | 0.009659 | $\lambda_{43}$ | 0.009924 |
| $\lambda_{29}$ | 0.000531 | $\lambda_{27}$ | 0.027786 | | |
| $\lambda_{30}$ | 0.000181 | $\lambda_{31}$ | 0.034293 | | |
| $\lambda_{31}$ | 0.003018 | $\lambda_{32}$ | 0.115611 | | |
| $\lambda_{39}$ | 0.059823 | $\lambda_{36}$ | 0.038221 | | |
| $\lambda_{40}$ | 0.029721 | $\lambda_{37}$ | 0.015155 | | |
| $\lambda_{99}$ | 0.130057 | | | | |
| $\lambda_{100}$ | 0.009966 | | | | |
| $\rho_6$ | 0.735676 | $\rho_{75}$ | 1.000000 | $\rho_{5500}$ | 1.000000 |
| $\rho_7$ | 0.264324 | | | | |
| Rate | 0.2670 b/s | Rate | 0.9300 b/s | Rate | 0.9990 b/s |
| Capacity | 0.2769 b/s | Capacity | 0.9339 b/s | Capacity | 0.9999 b/s |
| Loss | 0.0099 b/s | Loss | 0.0039 b/s | Loss | 0.0009 b/s |

Fig. 23. Optimized LDPC degree profiles for SWC-TCVQ with 256-state 2-D TCVQ. $\sigma_Y^2 = 1, \sigma_Z^2 = 0.10, X = Y + Z$; TCVQ rate $R = 5.5$ b/s, step size = 0.1936.

WYNER-ZIV CODING BASED ON TCQ AND LDPC CODES

The U.S. Government has a paid-up license in this invention and the right in limited circumstances to require the patent owner to license others on reasonable terms as provided for by the terms of grant number CCR-01-04834 awarded by the National Science Foundation (NSF) and grant number CCF-04-30720 also awarded by the NSF.

FIELD OF THE INVENTION

The present invention relates generally to the field of distributed source coding, and more specifically, to the field of Wyner-Ziv code design.

DESCRIPTION OF THE RELATED ART

The notation "[n]" is used repeatedly in this specification and is to be interpreted as a reference to the $n^{th}$ document in the list of references appearing at the end of this specification.

Wyner-Ziv coding [36] refers to lossy source coding with decoder side information. It is more general than the problem of near-lossless source coding with decoder side information considered by Slepian and Wolf [27]. Driven by a host of emerging applications (e.g., wireless video and distributed sensor networks), distributed source coding (e.g., Slepian-Wolf coding, Wyner-Ziv coding and various other forms of multiterminal source coding [3]) has recently become a very active research area—more than 30 years after Slepian and Wolf laid its theoretical foundation.

Unlike Slepian-Wolf coding [27], there is in general a rate loss with Wyner-Ziv coding when compared to lossy coding of source X with the side information Y available at both the encoder and the decoder (see for example the binary-symmetric Wyner-Ziv problem [36] and the code design for this problem in [18]). One exception is the quadratic Gaussian case, which corresponds to when the correlation between X and Y can be modeled by an AWGN channel as X=Y+Z, Z~N(0, $\sigma_Z^2$), with MSE distortion and arbitrarily distributed Y. The quadratic Gaussian case is special because theoretically there is no rate loss with Wyner-Ziv coding in this setup and in practice many image and video sources can be modeled as jointly Gaussian. (It was only shown in [36] that Wyner-Ziv coding of X suffers no rate loss when X and Y are zero mean and jointly Gaussian with MSE distortion. Pradhan et al. [22] recently extended this no rate loss result to the more general quadratic Gaussian case.)

Because we are introducing distortion to the source with Wyner-Ziv coding, quantization of X is unavoidable. Usually there is still correlation remaining in the quantized version Q(X) and the side information Y. Slepian-Wolf coding may be employed to exploit this correlation to reduce the rate from H(Q(X)) to H(Q(X)|Y). As suggested in [35], Slepian-Wolf coding can be implemented by partitioning the source sequences into bins (or cosets) with different syndromes of a channel code, and practical syndrome-based schemes for Slepian-Wolf coding using channel codes have been studied in [17], [23]. Thus, Wyner-Ziv coding is a source-channel coding problem [38]. There is quantization loss due to source coding and binning loss due to channel coding. In order to reach the Wyner-Ziv limit, one needs to employ both source codes (e.g., TCQ [19]) that can get close to the rate-distortion function and channel codes (e.g., turbo [4] or LDPC codes [21]) that can approach the Slepian-Wolf limit. In addition, the side information Y can be used in jointly decoding and optimally estimating $\hat{X}$ at the decoder to help reduce the average distortion E $\{d(X, \hat{X})\}$, especially at low rate.

In their information-theoretical work, Zamir et al. [43] outlined a constructive mechanism for quadratic Gaussian Wyner-Ziv coding using a pair of nested lattice codes. A Slepian-Wolf coded nested quantization (SWC-NQ) paradigm was proposed in [16] for Wyner-Ziv coding. At high rate, asymptotic performance bounds of SWC-NQ similar to those in classic source coding are established in [16], showing that ideal Slepian-Wolf coded 1-D/2-D nested lattice quantization performs 1.53/1.36 dB worse than the Wyner-Ziv distortion-rate function $D_{WZ}(R)$ with probability almost one; performances close to the corresponding theoretical limits were obtained by using 1-D and 2-D nested lattice quantizers, together with irregular LDPC codes for Slepian-Wolf coding. However, it is very difficult to implement high-dimensional lattice quantizers, and research on trellis-based nested codes as a way of realizing high-dimensional nested lattice codes has started recently [6], [18], [23], [26], [34].

SUMMARY

This specification considers trellis coded quantization (TCQ) and low density parity check (LDPC) codes for the quadratic Gaussian Wyner-Ziv coding problem. In one set of embodiments, after TCQ of the source input X, LDPC codes are used to implement Slepian-Wolf coding of the quantized source input Q(X) with side information Y at the decoder. Assuming 256-state TCQ and ideal Slepian-Wolf coding in the sense of achieving the theoretical limit H(Q(X)|Y), we experimentally show that Slepian-Wolf coded TCQ performs 0.2 dB away from the Wyner-Ziv distortion-rate function $D_{WZ}(R)$ at high rate. This result mirrors that of entropy-constrained TCQ in classic source coding of Gaussian sources. Furthermore, using 8,192-state TCQ and assuming ideal Slepian-Wolf coding, our simulations show that Slepian-Wolf coded TCQ performs only 0.1 dB away from $D_{WZ}(R)$ at high rate. These results establish the practical performance limit of Slepian-Wolf coded TCQ for quadratic Gaussian Wyner-Ziv coding. Practical designs give performance very close to the theoretical limit. For example, with 8,192-state TCQ, irregular LDPC codes for Slepian-Wolf coding and optimal non-linear estimation at the decoder, our performance gap to $D_{WZ}(R)$ is 0.20 dB, 0.22 dB, 0.30 dB, and 0.93 dB at 3.83 b/s, 1.83 b/s, 1.53 b/s, and 1.05 b/s, respectively. When 256-state 4-D trellis coded vector quantization instead of TCQ is employed, the performance gap to $D_{WZ}(R)$ is 0.51 dB, 0.51 dB, 0.54 dB, and 0.80 dB at 2.04 b/s, 1.38 b/s, 1.0 b/s, and 0.5 b/s, respectively.

BRIEF DESCRIPTION OF THE DRAWINGS

The following detailed description makes reference to the accompanying drawings, which are now briefly described.

FIG. 2 illustrates one embodiment of SWC-TCQ for Wyner-Ziv coding of quadratic Gaussian sources.

FIG. 3 illustrates TCQ index vector b={$b_0, b_1, \ldots, b_{L-1}$} decomposed into R bit planes.

FIG. 4 is an example of partitioning eight codewords into four cosets for a 2-bit TCQ.

FIG. 5 is a block diagram of one embodiment of a SWC-TCQ scheme.

FIG. 6 illustrates a partition of the real line into M+2 mini-cells.

FIG. 7 illustrates f(x|c,w) generated from the 2-bit TCQ shown in FIG. 3 with a quantization stepsize of $\lambda=0.575$ for $\sigma_x^2=1.28$. Dashed lines mark the centroids used in the quantizer decoder.

FIG. 8 illustrates one embodiment of multilevel Slepian-Wolf coding.

FIG. 9 illustrates the conditional PDFs for the hypothetical channel $B^r \to L^r$.

FIG. 10 is a table listing the convolutional codes used in our TCVQ simulations and the resulting granular gains.

FIG. 11 illustrates normalized conditional PDFs f(x|c,w) for 2-D and 4-D TCVQ.

FIG. 12a illustrates Wyner-Ziv coding results based on 256-state TCQ and Slepian-Wolf coding. At high rate, ideal Slepian-Wolf coded TCQ performs 0.2 dB away from the theoretical limit. Results with practical Slepian-Wolf coding based on irregular LDPC codes are also included.

FIG. 12b illustrates Wyner-Ziv coding results based on 8,192-state TCQ and Slepian-Wolf coding. At high rate, ideal Slepian-Wolf coded TCQ performs 0.1 dB away from the theoretical limit. Results with practical Slepian-Wolf coding based on irregular LDPC codes are also included.

FIG. 13 is a table listing the rate-½ convolutional codes (defined by octal form polynomials $h_0$ and $h_1$) used in our TCQ with different numbers of states.

FIG. 14 is a table which presents a comparison between optimal linear vs. non-linear estimation at the SWC-TCQ decoder. The correlation model is X=Y+Z, with Y~N(0,1) and Z~N(0,0.28). The block length in TCQ is $L=10^3$.

FIG. 15a illustrates Wyner-Ziv coding results based on 2-D TCVQ and Slepian-Wolf coding. At high rate, ideal Slepian-Wolf coded TCVQ performs 0.26 dB away from the theoretical limit.

FIG. 15b illustrates Wyner-Ziv coding results based on 4-D TCVQ and Slepian-Wolf coding. At high rate, ideal Slepian-Wolf coded TCVQ performs 0.32 dB away from the theoretical limit.

FIG. 16 is a table which presents a comparison between optimal linear vs. non-linear estimation at the SWC-TCQ decoder. The correlation model is X=Y+Z, with Y~N(0,1) and Z~N(0,0.1). The block length in TCQ is $L=10^3$ and the number of states is $N_s=256$.

FIG. 17 illustrates an equivalent realization of a convolutional code defined by $(h_0,h_1)=(5,2)_8$.

FIG. 18 is a table which presents optimal pairs of polynomials that maximize $d_{free}$.

FIG. 19 is a table which presents examples of distance profiles and the granular gains of two 256-state convolutional codes.

FIG. 20 is table which presents optimal pairs of polynomials found by the "list and simulate" method to maximize the granular gain.

FIG. 21 is a table which presents optimal sets of polynomials according to different criterions.

FIG. 22 is a table which presents the optimized LDPC degree profiles for Slepian-Wolf coded TCQ scheme with 8,192-state TCQ.

FIG. 23 is a table which presents the optimized LDPC degree profiles for Slepian-Wolf coded TCVQ scheme with 256-state 2-dimensional TCVQ.

While the invention is described herein by way of example for several embodiments and illustrative drawings, those skilled in the art will recognize that the invention is not limited to the embodiments or drawings described. It should be understood, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this specification, the word "may" is used in a permissive sense (i.e., in the sense of "having the potential to"), rather than in the mandatory sense (i.e., in the sense of "must"). Furthermore, the phrase "A includes B" is used to mean "A includes B, but is not limited to B".

DETAILED DESCRIPTION

Figure 1A:
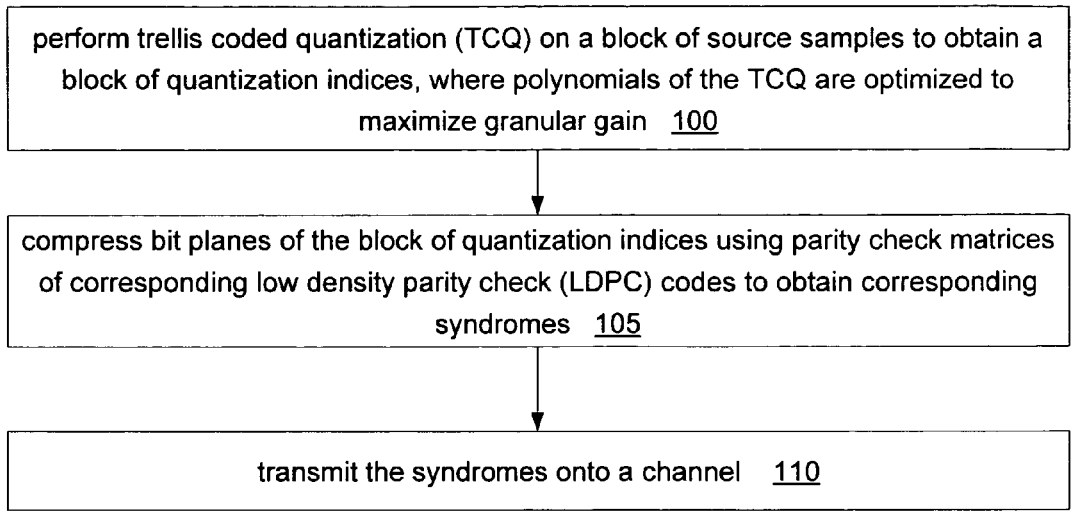
FIG. 1A illustrates one set of embodiments of a method for encoding information from a source.

In one set of embodiments, a method for encoding information from a source may involve the following actions, as illustrated in FIG. 1A.

At 100, trellis coded quantization (TCQ) may be performed on a block of samples of the source to obtain a block of quantization indices. The polynomials of the TCQ will have been optimized to maximize granular gain at code design time. See section VII-B for more information on how to optimize the polynomials of the TCQ.

The source may be a continuous source. However, in some embodiments, the source may be a discrete source having a finite alphabet.

At 105, bit planes of the block of quantization indices may be compressed using parity check matrices of corresponding low density parity check (LDPC) codes to obtain corresponding syndromes. In particular, each of the bit planes may be compressed using a corresponding one of the parity check matrices. The parity check matrix for each of the bit planes may be separately optimized.

At 110, the syndromes may be transmitted onto a channel. In some embodiments, the channel is assumed to be a noiseless channel.

In some embodiments, the number of states of the TCQ is greater than 256. In other embodiments, the number of states of the TCQ is greater than 2048. Larger numbers of states are useful in obtaining larger granular gains.

In some embodiments, each of the parity check matrices is separately optimized to minimize bit error rate for the corresponding bit plane. See Section IX below for more information on how to optimize the parity check matrices. The optimization method may guarantee that each of the bit planes is compressed at a rate that approaches close to the limit for Slepian-Wolf coding, e.g., to within 0.01 bit per sample (b/s) of the limit for Slepian-Wolf coding at a block length of 1,000,000 samples.

In some embodiments, the method of FIG. 1A may be performed by a system including a trellis coded quantization unit, a compression unit and a transmitter which are configured to perform actions 100, 105 and 110 respectively. The system may be implemented using dedicated circuitry (e.g., one or more ASICs) and/or one or more programmable devices (e.g., processors, FPGAs, etc.).

In one set of embodiments, a method for decoding information received from a channel may involve the following actions, as illustrated in FIG. 11B.

At 115, a set of syndromes may be received from a channel. The set of syndromes are generated by an encoder configured to:
- perform trellis coded quantization (TCQ) on a block of samples of a source to obtain a block of quantization indices, wherein polynomials of the TCQ are optimized to maximize granular gain;
- compress bit planes of the block of quantization indices using parity check matrices of corresponding low density parity check (LDPC) codes to obtain corresponding ones of the syndromes; and
- transmit the syndromes onto the channel.

In some embodiments, the channel may be a noiseless channel. Thus, the syndromes may received from the channel exactly as they were generated by the encoder.

At 120, the syndromes may be decoded (i.e., decompressed), using side information, to obtain an estimate of the block of quantization indices. See Section V-C below for more information of how to perform the decoding process. The side information is assumed to be correlated with the source. For example, the source and the side information may be interpreted as sequences of drawings of random variables X and Y respectively, where X and Y conform to the expression Y=X+Z, where Z is a random variable representing the noise of a virtual channel connecting X and Y.

In some embodiments, the decoding process may be performed in a progressive fashion, e.g., as follows. Let R denote the depth (in bits) of each quantization index, where R is a positive integer. Let $b^0, b^1, b^2, \ldots, b^{R-1}$ denote the R bit planes of the block of quantization indices, where $b^0$ is the least significant bit plane and $b^{R-1}$ is the most significant bit plane. Let $s^0, s^1, s^2, \ldots, s^{R-1}$ denote the R corresponding syndromes. The side information and the syndrome $s^0$ may be used to generate an estimate for bit plane $b^0$. The side information, the syndrome $s^1$ and the estimate for $b^0$ may be used to generate an estimate for bit plane $b^1$. In general, for n=1, 2, ..., (R−1), the side information, the syndrome $s^n$ and the estimates for $b^0, b^1, \ldots, b^{n-1}$ may be used to generate an estimate for bit plane $b^n$. Thus, the decoding process may be involve R successive decoding stages. The iterative message-passing algorithm (also referred to as the belief propagation algorithm) may be used to implement each decoding stage. Each decoding stage may utilize a graph that represents the corresponding LDPC encoder.

At 125, an estimate for the block of source samples may be generated using the estimate of the block of quantization indices and the side information. In one embodiment, this estimation process may be based on a non-linear estimator. See section V-D for description of the non-linear estimator. In another embodiment, the estimation process may be based on a linear estimator. See section V-D for description of the linear estimator.

Figure 1B:
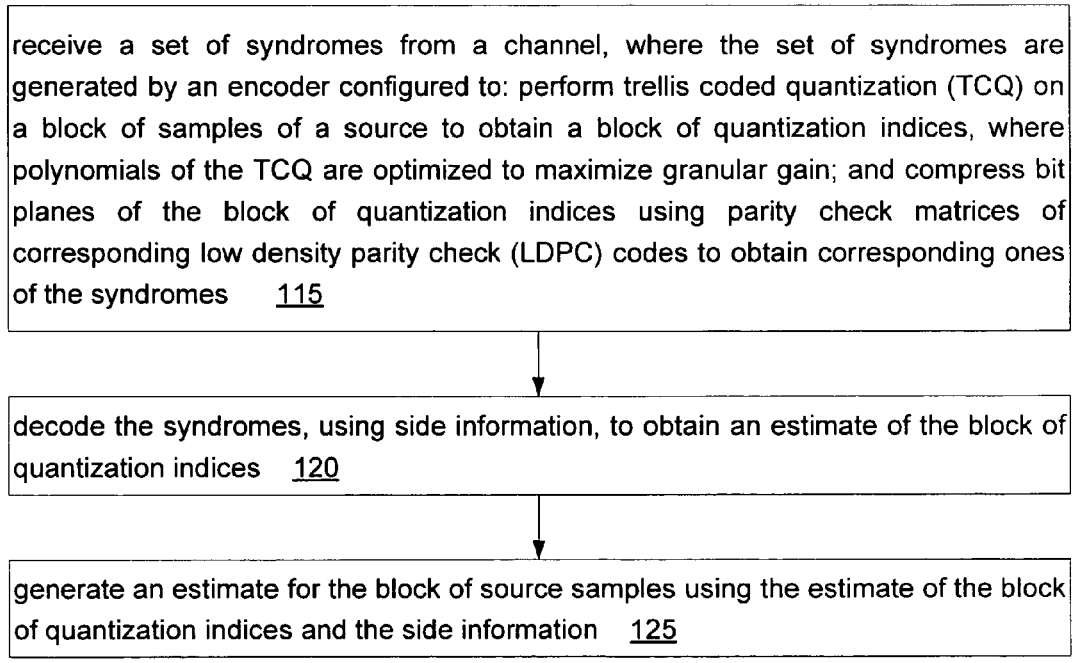
FIG. 1B illustrates one set of embodiments of a method for decoding information received from a channel.

In some embodiments, the method of FIG. 1B may be performed by a system including decoder unit and an estimation unit which are configured to perform actions 120 and 125 respectively. The system may be implemented using dedicated circuitry (e.g., one or more ASICs) and/or one or more programmable devices (e.g., processors, FPGAs, etc.).

In some embodiments, portions of the encoding method and/or the decoding method may be parallelized. The most computationally intensive part of the encoding method is the TCQ. Since the Viterbi algorithm is carried out sample by sample, the computation time is linear with the block length. On the other hand, at each trellis stage, the calculations at the $N_s$ different states are independent of each other. Thus, it is possible to build $N_s$ identical processing units and parallelize the computations at each stage. Hence the total computation time can be made independent of the number of states $N_s$. This implies that excellent quantization performance may be achieved with large $N_s$. Also, this parallel arrangement may allow the TCQ to operate in real time, as far as the hardware resources permit.

The most computationally intensive part of the decoding method is the syndrome decoding process 120. The syndrome decoding process uses the belief propagation algorithm for LDPC decoding. The belief propagation algorithm may be implemented on FPGAs, e.g., using a semi-parallel architecture as described by Marjan Karkooti and Joseph R. Cavallaro in "Semi-Parallel Reconfigurable Architectures for Real-Time LDPC Decoding", IEEE Proceedings of International Conference on Information Technology: Coding and Computing, ITCC '04, pp. 579-585, Vol. 1, April, 2004. Thus, the syndrome decoding process may be implemented as a real-time process.

Figure 1C:
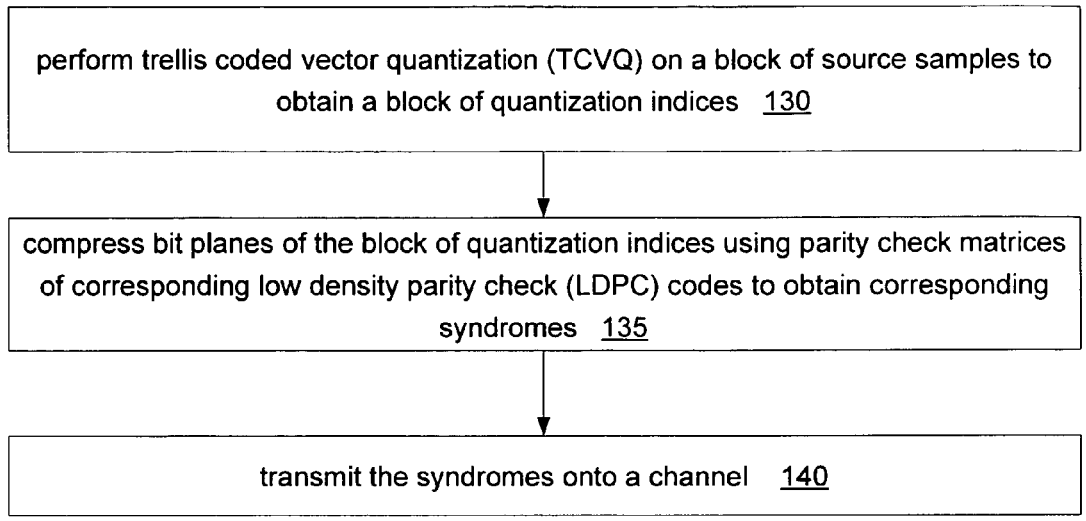
FIG. 1C another set of embodiments of a method for encoding information from a source.

In one set of embodiments, a method for encoding information from a source may involve the following actions, as illustrated in FIG. 1C.

At 130, trellis coded vector quantization (TCVQ) may be performed on a block of samples of a source to obtain a block of quantization indices. See section VIII-C for a description of the process of designing the TCVQ polynomials.

At 135, bit planes of the block of quantization indices may be compressed using parity check matrices of corresponding low density parity check (LDPC) codes to obtain corresponding syndromes. See section IX for a description of the process for designing the parity check matrices.

In some embodiments, each of the parity check matrices is separately optimized to minimize bit error rate for the corresponding bit plane. See Section IX below for more information on how to optimize the parity check matrices. The optimization method may guarantee that each of the bit planes is compressed at a rate that approaches close to the limit for Slepian-Wolf coding. For example, see the results illustrated in FIG. 22 and FIG. 23.

At 140, the syndromes may be transmitted onto a channel.

In some embodiments, the method of FIG. 1C may be performed by a system including an trellis coded vector quantization (TCVQ) unit, a compression unit and a transmitter which are configured to perform actions 130, 135 and 140 respectively. The system may be implemented using dedicated circuitry (e.g., one or more ASICs) and/or one or more programmable devices (e.g., processors, FPGAs, etc.).

Figure 1D:
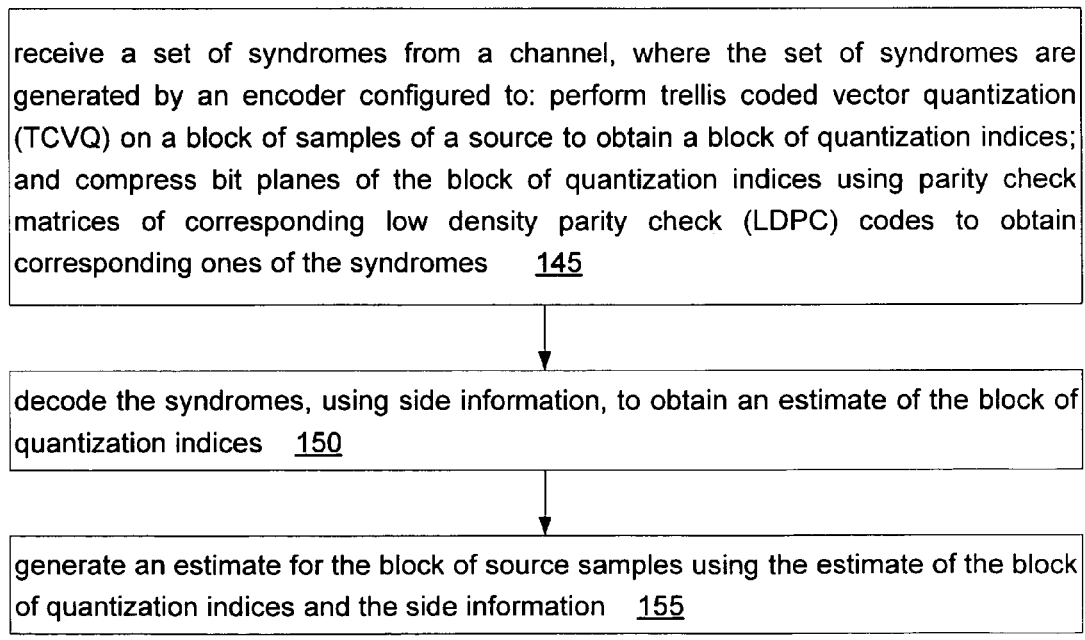
FIG. 1D illustrates another set of embodiments of a method for decoding information received from a channel.

In one set of embodiments, a decoding method may involve the following actions, as illustrated in FIG. 1D.

At 145, a set of syndromes may be received from a channel. The set of syndromes are generated by an encoder configured to:
- perform trellis coded vector quantization (TCVQ) on a block of samples of a source to obtain a block of quantization indices; and
- compress bit planes of the block of quantization indices using parity check matrices of corresponding low density parity check (LDPC) codes to obtain corresponding ones of the syndromes.

At 150, the syndromes may be decoded, using side information, to obtain an estimate of the block of quantization indices. The decoding process may be performed progressively as described above.

At 155, an estimate for the block of source samples may be generated using the estimate of the block of quantization indices and the side information.

In some embodiments, the method of FIG. 1D may be performed by a system including a decoder unit and an estimation unit which are configured to perform actions 150 and 155 respectively. The system may be implemented using dedicated circuitry (e.g., one or more ASICs) and/or one or more programmable devices (e.g., processors, FPGAs, etc.).

In some embodiments, a computer-readable memory medium may be configured to store program instructions, where the program instructions are executable to implement any of the method embodiments described herein (or any combination of the method embodiments described herein).

A memory medium is a medium configured for the storage of information. Examples of memory media include various kinds of magnetic media (e.g., magnetic tape, magnetic disk, magnetic strips, and magnetic film); various kinds of optical media (e.g., CD-ROM); various kinds of semiconductor RAM and ROM; various media based on the storage of electrical charge and/or other physical quantities; etc.

In some embodiments, a computer system may be configured to include a processor and memory medium. The memory medium may be configured to store program instructions. The processor may be configured to read and execute the program instructions. The program instructions may be executable to implement any of the various method embodiments described herein. The computer system may be realized in any of various forms. For example, the computer system may be a personal computer (in any of its various forms), a computer on a card, a server computer, a client computer, a computer system embedded in a sensor device, etc.

In one set of embodiments, a method for determining a set of polynomials for performing trellis coded quantization may involve the actions described in sections VI-A and VIII. The set of polynomials thusly determined may give a large value of granular gain, e.g., a value larger than a set of polynomials selected on the basis of maximizing free distance. The set of polynomials determined by the method may be used to configure a trellis coded quantizer. For example, the coefficients of the set of polynomials may be loaded into memory locations of a hardware device. The hardware device uses the coefficients to implement the trellis coded quantizer. The hardware device may include one or more dedicated circuits and/or one or more programmable devices (such as FPGAs or processors). The trellis coded quantizer thusly configured may be used in many practical applications (especially applications that deal with continuous sources) including the capture, storage, compression and transmission of various types of data, e.g., documents, multimedia data, physical sensor measurements, etc.

In one set of embodiments, a method for designing an LDPC code for Slepian-Wolf coding may involve the actions described below in section IX. The LDPC code thusly determined may be used to configure an LDPC encoder or an LDPC decoder. For example, the parity check matrix of the LDPC code may be loaded into the memory of a hardware device. The hardware device uses the parity check matrix to implement the LDPC encoder (or decoder). The hardware device may include one or more dedicated circuits and/or one or more programmable devices (such as FPGAs or processors). The LDPC encoder (or decoder) thusly configured may be used in many practical applications including wireless video, distributed sensor networks, etc.

In this specification (especially in sections I-IX below), we present various embodiments of a SWC-TCQ scheme for quadratic Gaussian Wyner-Ziv coding, establish its performance limit, and describe practical code designs. Our results with SWC-TCQ at high rate and with SWC-TCVQ at low rate are by far the best in the literature. The small performance loss with our practical designs comes from two aspects: suboptimality of TCQ/TCVQ over infinite-dimensional vector quantization and rate loss in practical LDPC code based Slepian-Wolf coding.

With the results in this specification, we believe that we have advanced the art of practical code design in the context of Wyner-Ziv coding. Applications of the SWC-TCQ scheme to interesting areas such as receiver cooperation in wireless ad hoc networks and error-robust video coding are contemplated. See [29] for more information on the subject of receiver cooperation. See [39] for more information on the subject of error-robust video coding.

I. INTRODUCTION

Wyner-Ziv coding [37] refers to lossy source coding with decoder side information. It is more general than the problem of near-lossless source coding with decoder side information considered by Slepian and Wolf [28]. Driven by a host of emerging applications (e.g., wireless video and distributed sensor networks), distributed source coding (e.g., Slepian-Wolf coding, Wyner-Ziv coding and various other forms of multiterminal source coding [3]) has recently become a very active research area—more than 30 years after Slepian and Wolf laid its theoretical foundation.

Unlike Slepian-Wolf coding [28], there is in general a rate loss with Wyner-Ziv coding when compared to lossy coding of source X with the side information Y available at both the encoder and the decoder (see for example the binary-symmetric Wyner-Ziv problem [37] and the code design for this problem in [18]). One exception is the quadratic Gaussian case, which corresponds to when the correlation between X and Y can be modeled by an AWGN channel as X=Y+Z, Z~N(0, $\sigma_Z^2$), with MSE distortion and arbitrarily distributed Y. The quadratic Gaussian case is special because theoretically there is no rate loss with Wyner-Ziv coding in this setup and in practice many image and video sources can be modeled as jointly Gaussian. (It was only shown in [37] that Wyner-Ziv coding of X suffers no rate loss when X and Y are zero mean and jointly Gaussian with MSE distortion. Pradhan et al. [22] recently extended this no rate loss result to the more general quadratic Gaussian case.)

Because we are introducing distortion to the source with Wyner-Ziv coding, quantization of X is unavoidable. Usually there is still correlation remaining in the quantized version Q(X) and the side information Y, Slepian-Wolf coding may be employed to exploit this correlation to reduce the rate from H(Q(X)) to H(Q(X)|Y). (Throughout the specification, Slepian-Wolf coding means near-lossless source coding with side information at the decoder.) As suggested in [36], Slepian-Wolf coding can be implemented by partitioning the source sequences into bins (or cosets) with different syndromes of a channel code, and practical syndrome-based schemes for Slepian-Wolf coding using channel codes have been studied in [17], [23]. Thus, Wyner-Ziv coding is a source-channel coding problem [39]. There is quantization loss due to source coding and binning loss due to channel coding. In order to reach the Wyner-Ziv limit, one needs to employ both source codes (e.g., TCQ [19]) that can get close to the rate-distortion function and channel codes (e.g., turbo [4] or LDPC codes [21]) that can approach the Slepian-Wolf limit. In addition, the side information Y can be used in jointly decoding and optimally estimating X̂ at the decoder to help reduce the average distortion E{d(X, X̂)}, especially at low rate.

In their information-theoretical work, Zamir et al. [44] outlined a constructive mechanism for quadratic Gaussian Wyner-Ziv coding using a pair of nested lattice codes. A Slepian-Wolf coded nested quantization (SWC-NQ) paradigm was proposed in [16] for Wyner-Ziv coding. At high rate, asymptotic performance bounds of SWC-NQ similar to those in classic source coding are established in [16], showing that ideal Slepian-Wolf coded 1-D/2-D nested lattice quantization performs 1.53/1.36 dB worse than the Wyner-Ziv distortion-rate function $D_{WZ}(R)$ with probability almost one; performances close to the corresponding theoretical limits were obtained by using 1-D and 2-D nested lattice quantizers, together with irregular LDPC codes for Slepian-Wolf coding. However, it is very difficult to implement high-dimensional lattice quantizers, and research on trellis-based nested codes as a way of realizing high-dimensional nested lattice codes has started recently [6], [18], [23], [27], [35].

In one set of embodiments, we use TCQ (the most powerful practical quantizer) and LDPC codes (the most powerful channel codes) for quadratic Gaussian Wyner-Ziv coding, where the role of LDPC codes is Slepian-Wolf coding (or practical syndrome-based binning for compression [5], [17]). Our separate source-channel coding approach of SWC-TCQ leaves all the binning task to the Slepian-Wolf code after TCQ of the source X and allows for the best possible binning via powerful LDPC codes. Assuming high rate—meaning that under the model $X=Y+Z$ with $Z \sim N(1, \sigma_Z^2)$, the distortion D from Wyner-Ziv coding of source X is small compared to $\sigma_Z^2$, and ideal Slepian-Wolf coding (or binning) of the quantized source $Q(X)$ with side information Y at the decoder—in the sense of achieving the theoretical limit $H(Q(X)|Y)$, the performance loss of our proposed Wyner-Ziv code is limited to that from the TCQ source code alone.

Our simulations show that with 256-state TCQ and ideal Slepian-Wolf coding, SWC-TCQ performs 0.2 dB away from $D_{WZ}(R)$ at high rate in the quadratic Gaussian case. This 0.2 dB gap is the same as that between the performance of entropy-constrained TCQ (ECTCQ) [12], [20], [31] and the distortion-rate function $D_X(R)$ [8] in classic source coding of Gaussian sources. These results and those in [16] allow one to compare the performances of high-rate Wyner-Ziv coding and classic source coding of Gaussian sources [15]. Our approach involves optimizing the generator polynomial for trellis codes using the criterion of maximizing granular gain. We design trellis-coded quantizers with more than 256 states and obtain a gap of only 0.1 dB from $D_{WZ}(R)$ at high rate using 8,192-state TCQ (again assuming ideal Slepian-Wolf coding).

In practical Wyner-Ziv code designs, owing to the importance of estimation at the decoder, we further devise an optimal non-linear estimator by exploiting the statistics of TCQ indices. We also employ trellis-coded vector quantization (TCVQ) [11] as another means of reducing the rate (besides Slepian-Wolf coding) when the target rate budget is low (e.g., less than one b/s). We note that our novel non-linear estimation scheme at the decoder can yield sizable gains only at low rate. At high rate, simulations indicate that linear and non-linear estimation at the decoder give almost the same results.

Practical designs with 8,192-state TCQ, irregular LDPC codes for Slepian-Wolf coding and optimal estimation at the decoder perform 0.20 dB, 0.22 dB, 0.30 dB, and 0.84 dB away from $D_{WZ}(R)$ at 3.83 b/s, 1.83 b/s, 1.53 b/s, and 1.05 b/s, respectively. With 2-D TCVQ, the performance gap to $D_{WZ}(R)$ is 0.47 dB, 0.52 dB, 0.54 dB, and 0.66 dB at 3.32 b/s, 2.33 b/s, 1.53 b/s, and 1.0 b/s, respectively. Finally, with 4-D TCVQ, the performance gap to $D_{WZ}(R)$ is 0.51 dB, 0.51 dB, 0.54 dB, and 0.80 dB at 2.04 b/s, 1.38 b/s, 1.0 b/s, and 0.5 b/s, respectively.

Section II gives the background on Slepian-Wolf coding and Wyner-Ziv coding. Section III offers Wyner-Ziv code design guidelines. Section IV introduces our framework of SWC-TCQ for Wyner-Ziv coding. Section V details our designs based on TCQ and LDPC codes. Section VI covers our designs based on TCVQ and LDPC codes. Section VII gives experimental results and Section VIII provides detailed TCQ design algorithms. Section IX describes the LDPC code design algorithm.

II. THEORETICAL BACKGROUND

We start with a word on notation. Random variables are denoted by capital letters (e.g., X, Y) and realizations of them by lower-case letters (e.g., x, y). Random vectors are denoted by bold capital letters (e.g., X, Y) and realizations of them by bold lower-case letters (e.g., x, y). Expectation of a function $f(X, Y)$ over both X and Y is denoted as $E_{X,Y}\{f(X, Y)\}$. The subscript "$_{X,Y}$" will be dropped when it is clear from the context.

Slepian-Wolf coding [28] concerns with near-lossless source coding with side information at the decoder. For lossless compression of a pair of correlated, discrete random variables X and Y, a rate of $R_X+R_Y=H(X,Y)$ is possible if they are encoded jointly [15]. However, Slepian and Wolf [28] showed that the rate $R_X+R_Y=H(X,Y)$ is almost sufficient even for separate encoding (with joint decoding) of X and Y. Specifically, the Slepian-Wolf theorem says that the achievable region for coding X and Y is given by $$R_X \geq H(X|Y), R_Y \geq H(Y|X), R_X+R_Y \geq H(X,Y). \quad (1)$$

This result shows that there is no loss of coding efficiency with separate encoding when compared to joint encoding as long as joint decoding is performed. When the side information (e.g., Y) is perfectly available at the decoder, then the aim of Slepian-Wolf coding is to compress X to the rate limit $H(X|Y)$.

Wyner-Ziv coding [37], [38] deals with the problem of rate-distortion with side information at the decoder. It asks the question of how many bits are needed to encode X under the constraint that $E\{d(X, \hat{X})\} \leq D$, assuming the side information Y is available at the decoder but not at the encoder. This problem generalizes the setup of [28] in that coding of X is lossy with respect to a fidelity criterion rather than lossless. For both discrete and continuous alphabets of $\mathcal{X}$ and general distortion metrics $d(\bullet)$, Wyner and Ziv [37] gave the rate-distortion function $R_{WZ}(D)$ for this problem as $R_{WZ}(D)=\inf I(X; U|Y)$, where the infimum is taken over all auxiliary random variables U such that $Y \to X \to U$ is a Markov chain and there exists a function $\hat{X}=\hat{X}(U, Y)$ satisfying $E\{d(X, \hat{X})\} \leq D$. According to [37], $$R_{WZ}(D) \geq R_{X|Y}(D) = \inf_{\{\hat{X} \in \mathcal{X}: E[d(X, \hat{X})] \leq D\}} I(X; \hat{X}|Y),$$

where $R_{X|Y}(D)$ is the classic rate-distortion function of coding X with side information Y available at both the encoder and the decoder. Compared to coding of X when the side information Y is also available at the encoder, there is in general a rate loss with Wyner-Ziv coding. Zamir quantified this loss in [42], showing a <0.22 bit loss for binary sources with Hamming distance and a <0.5 b/s loss for continuous sources with MSE distortion.

When D is very small and the source is discrete-valued, the Wyner-Ziv problem degenerates to the Slepian-Wolf problem with $R_{WZ}(D)=R_{X|Y}(D)=H(X|Y)$. Another interesting setup is the quadratic Gaussian case with the source model being $X=Y+Z$ and $Z \sim N(0, \sigma_Z^2)$, then $$R_{WZ}(D) = R_{X|Y}(D) = \frac{1}{2}\log^+\left[\frac{\sigma_Z^2}{D}\right],$$

where $\log^+ x = \max\{\log x, 0\}$, i.e., there is no rate loss in this case. Note that Y is arbitrarily distributed [22]. When Y is also Gaussian, then X and Y are jointly Gaussian memoryless sources. This case is of special interest in practice because many image and video sources can be modeled as jointly Gaussian and Wyner-Ziv coding suffers no rate loss. For the sake of simplicity, we consider this specific case in our code designs.

III. WYNER-ZIV CODE DESIGN GUIDELINES

From an information-theoretical perspective, according to [13], there are granular gain and boundary gain in source coding, and packing gain and shaping gain in channel coding. Wyner-Ziv coding is foremost a source coding (i.e., a rate-distortion) problem. Thus, one should consider the granular gain and the boundary gain. In addition, the side information necessitates channel coding for compression (e.g., via syndrome-based binning scheme [36]), which utilizes a linear channel code together with its coset codes. Thus channel coding in Wyner-Ziv coding is not conventional in the sense that there is only packing gain, but no shaping gain. One needs to establish the equivalence between the boundary gain in source coding and the packing gain in channel coding for Wyner-Ziv coding; this is feasible because channel coding for compression in Wyner-Ziv coding can perform conditional entropy coding to achieve the boundary gain—the same way as entropy coding achieves the boundary gain in classic source coding [13] [31, p. 123]. Then in Wyner-Ziv coding, one can shoot for the granular gain via source coding and the boundary gain via channel coding.

From a practical viewpoint, because we are introducing distortion to the source with Wyner-Ziv coding, source coding is needed to quantize X. Usually there is still correlation remaining in the quantized version of X and the side information Y, and Slepian-Wolf coding should be employed to exploit this correlation to reduce the rate. Since Slepian-Wolf coding is based on channel coding, Wyner-Ziv coding is a source-channel coding problem [39]. There are quantization loss due to source coding and binning loss due to channel coding. In order to reach the Wyner-Ziv limit, one needs to employ both source codes (e.g., TCQ) that can achieve the granular gain and channel codes (e.g., turbo and LDPC codes) that can approach the Slepian-Wolf limit. In addition, the side information Y can be used in jointly decoding and estimating $\hat{X}$ at the decoder to help reduce the distortion $d(X, \hat{X})$ for non-binary sources, especially at low bit rate. The intuition is that in decoding X, the joint decoder should rely more on Y when the rate is too low to make the coded version of X to be useful in terms of lowering the distortion. On the other hand, when the rate is high, the coded version of X becomes more reliable than Y so the decoder should put more weight on the former in estimating $\hat{X}$.

IV. SWC-TCQ

Following the guidelines given in the previous section, we propose an SWC-TCQ framework for Wyner-Ziv coding of quadratic Gaussian sources. The block diagram of SWC-TCQ is depicted in FIG. 2. At the encoder, a length-L block of source samples $x=\{x_0, x_1, \ldots, x_{L-1}\}$ is first quantitized by an R-bit TCQ, yielding a quantization index vector $Q(x)=b=\{b_0, b_1, \ldots, b_{L-1}\}$. Write each R-bit index $b_i$, $0 \leq i \leq L-1$ as $b^i = b_i^{R-1} \ldots b_i^1 b_i^0$ in its binary representation and decompose b into R bit planes, with $b^r=\{b_0^r, b_1^r, \ldots, b_{L-1}^r\}$, $0 \leq r \leq R-1$. These bit planes of b are then compressed via multilevel syndrome-based Slepian-Wolf coding [22] (with side information Y at the decoder). The output length-l binary message s is the syndrome of the underlying channel code for Slepian-Wolf coding. The rate of SWC-TCQ is $$R_X = \frac{l}{L} b/s.$$

Because the Wyner-Ziv decoder has access to the side information $y=\{y_0, y_1, \ldots, y_{L-1}\}$, which is correlated to x, the Slepian-Wolf compression limit with near-lossless reconstruction of b is $$H(Q(X)|Y) = \frac{1}{L}H(B|Y)[28],$$

where $B=\{B_0, B_1, \ldots, B_{L-1}\}$ is the discrete random vector associate with b, and $Y=\{Y_0, Y_1, \ldots, Y_{L-1}\}$ the continuous random vector associated with y. We then have $$R_X \geq \frac{1}{L}H(B|Y).$$

Since b can be decomposed into R bit planes, as depicted in FIG. 3, we denote $B^r$ as the binary random vector associated with bit plane $b^r=\{b_0^r, b_1^r, \ldots, b_{L-1}^r\}$, $0 \leq r \leq R-1$.

Upon receiving the output syndrome s from the encoder, the decoder combines it with y to jointly reconstruct b as $\hat{b}$ before producing an estimate $\hat{x}$ of x based on $\hat{b}$ and y, namely $\hat{x}=E\{X|\hat{b}, y\}$.

SWC-TCQ involves separate TCQ and Slepian-Wolf coding at the encoder, and joint decoding and estimation at the decoder, with the aim of minimizing the average $$MSE\ D = E\{d(X, \hat{X})\} = \frac{1}{L}E\{d(X, \hat{X})\} = \frac{1}{L}\sum_{i=0}^{L-1}E\{(X_i - \hat{X}_i)^2\},$$

subject to a given budget constraint on the rate $R_X$, where $X_i$ and $\hat{X}_i$ are the continuous random variables associated with $x_i$ and $\hat{x}_i$, respectively.

Before addressing the performance limit of high-rate SWC-TCQ, we review classic TCQ and recent advances on Slepian-Wolf code designs based on LDPC codes. Details about Slepian-Wolf coding of B to approach the compression limit $$H(Q(X)|Y) = \frac{1}{L}H(B|Y)$$

and the optimal non-linear estimator tailor-designed for TCQ will be given in Section V.

A. Trellis-Coded Quantization (TCQ)

TCQ [19] is the source coding counterpart of TCM [33]. It can be viewed as a form of vector quantization because of the expanded signal set it uses. Due to its excellent MSE performance at modest complexity, TCQ is the most powerful practical source coding technique available today.

Suppose we need to quantize a continuous source X using rate R b/s. TCQ first takes a codebook of size $2^{R+\tilde{R}}$ (denoted as $\mathcal{D}$), and equally partitions it into $2^{\tilde{R}+1}$ subsets, each having $2^{R-1}$ codewords. Normally, $\tilde{R}$ is set to one. Hence, we have four subsets (also referred to as cosets), denoted as $\mathcal{D}_0$, $\mathcal{D}_1$, $\mathcal{D}_2$, and $\mathcal{D}_3$. Then $\mathcal{D} = \cup_{i=0}^{3} \mathcal{D}_i$. An example of the partitioning procedure with R=2 and $\tilde{R}$=1 is illustrated in FIG. 4. In general, the consecutive codewords are labelled as $\mathcal{D}_0, \mathcal{D}_1, \mathcal{D}_2, \mathcal{D}_3; \ldots; \mathcal{D}_0, \mathcal{D}_1, \mathcal{D}_2, \mathcal{D}_3$ and denoted as $q_c^w$, w=0, 1, ..., $2^{R-1}$–1, c=0, 1, 2, 3, where c is called the coset index, and w the codeword index.

A trellis is a possibly time-dependent state transition diagram of a finite-state machine. More specifically, a length-L trellis T is a concatenation of L mappings, where the i-th mapping ($0 \leq i \leq L-1$) is from the i-th state $S_i$ of the machine and the i-th input message $b_i^0$ to the next state $S_{i+1}$, and the i-th output message $c_i$, i.e., $\mathbf{T} = \{\phi_i\}_{i=0}^{L-1}$ with $\phi_i:(S_i, b_i^0) \mapsto (S_{i+1}, c_i)$. The trellises used in TCQ are usually time-invariant and are based on an underlying convolutional code, which is systematic with rate ½. Under this constraint, we can define a trellis T by one of its component mappings $\phi_i \equiv \phi:(S_{current}, b^0) \mapsto (S_{next}, c)$, where $b^0$ is a binary input and c is a 2-bit output with $0 \leq c \leq 3$. The input-output relation of T can be summarized as $c = \mathbf{T}(b^0)$.

Based on a size-$2^{R+1}$ codebook $\mathcal{D}$ and a length-L trellis T with $N_s$-state machine, the source X is quantized by using the Viterbi algorithm one block x at a time. We associate $x_i$ in x with the coset $\mathcal{D}_{c_i}$ indexed by the output $c_i$ of the trellis, and define the distortion for $x_i$ as $D_i(c_i) = \min_{w_i} \|x_i - q_{c_i}^{w_i}\|^2$, which is the distortion between $x_i$ and the codeword in $\mathcal{D}_{c_i}$ that is closest to $x_i$. The Viterbi algorithm then searches for the input binary vector $b^0 = \{b_0^0, b_1^0, \ldots, b_{L-1}^0\}$ that minimizes the accumulated distortion defined as $D(b^0) = \Sigma_{i=0}^{L-1} D_i(\mathbf{T}_i(b^0))$, where $\mathbf{T}_i(b^0) = c_i$ is the i-th trellis output corresponding to the input vector $b^0$. To sum up, TCQ implements the following two functions $$b^0 = \arg\min_{a \in \{0,1\}^L} \sum_{i=0}^{L-1} D_i(\mathbf{T}_i(a)) = \arg\min_{a \in \{0,1\}^L} \sum_{i=0}^{L-1} \min_{0 \leq w \leq 2^{R-1}-1} \left\| x_i - q_{\mathbf{T}_i(a)}^{w} \right\|^2, \quad (2)$$

$$w_i \triangleq \mathcal{W}(x_i, c_i) = \mathcal{W}(x_i, \mathbf{T}_i(b^0)) = \arg\min_{0 \leq w \leq 2^{R-1}-1} \|x_i - q_{c_i}^w\|^2, \quad (3)$$

for $0 \leq i \leq L - 1$.

Finally, TCQ stacks the R–1 bit planes of the codeword vector $\{w_0, w_1, \ldots, w_{L-1}\}$ on top of the trellis bit vector $b^0$ to form its output index vector $b = \{b_0, b_1, \ldots, b_{L-1}\}$, achieving a rate of R b/s, where $b_i = (w_i^T, b_i^0)^T$, with $w_i = (b_i^{R-1}, \ldots, b_i^1)^T$ coming from the binary representation of $w_i = b_i^{R-1} \ldots b_i^2 b_i^1$.

From the operation of TCQ in (2) and (3), we see that only the last bit plane $b^0$ in b has memory and that the codeword vector is memoryless given $b^0$. More precisely, the Markov chains $w_i \to b^0 \to w_j$ hold for any $0 \leq i \neq j \leq L-1$.

The performance of TCQ with a trellis of $N_s$=256 states is 0.2 dB away from the distortion-rate bound for uniform sources, which is better than any vector quantizer of dimension less than 69 [31]. With the help of entropy coding, the same 0.2 dB gap can be obtained at all rates by ECTCQ [12], [20], [31] for any smooth probability density function (PDF) by using carefully designed codebooks.

B. Slepian-Wolf Coding Based on LDPC Codes

The Slepian-Wolf theorem was proved using random binning arguments [8]. The main idea is to randomly partition all length-n sequences into disjoint bins, transmit the index of the bin containing the source sequence, and pick from the specified bin a source sequence that is jointly typical with the side information sequence at the decoder. It is shown in [28] that asymptotically no rate loss is incurred in Slepian-Wolf coding by not having the side information at the encoder.

However, there is no efficient decoding algorithm for such a random binning scheme. The first step toward constructive Slepian-Wolf code was given in [36], suggesting the use of parity-check code to partition all the source sequences into bins with different syndromes. The syndrome here plays the role of the bin index in the random binning scheme. Unlike classic channel coding, the set of all the valid codewords (with zero syndrome) forms one bin of source sequences, while other bins are shifts of this zero-syndrome bin. This approach is detailed below.

Let $\mathcal{C}$ be an (n, k) binary linear block code with generator matrix $G_{k \times n}$ and parity-check matrix $H_{(n-k) \times n}$ such that $GH^T = 0$. The syndrome of any length-n binary sequence u with respect to code $\mathcal{C}$ is defined as $v = uH^T$, which is indeed a length-(n–k) binary sequence. Hence there are $2^{n-k}$ distinct syndromes, each indexing $2^k$ length-n binary sequences. A coset $\mathcal{C}_v$ of code $\mathcal{C}$ is defined as the set of all sequences with syndrome v, i.e., $\mathcal{C}_v = \{u \in \{0,1\}^n : uH^T = v\}$.

Consider the problem of Slepian-Wolf coding of a binary source U with decoder side information Y (with discrete [28] or continuous [16] alphabet). Syndrome based Slepian-Wolf coding of u proceeds as follows:

Encoding: The encoder computes the syndrome $v = uH^T$ and sends it to the decoder at rate $$R^{SW} = \frac{n-k}{n} \, b/s.$$

By the Slepian-Wolf theorem [28], $$R^{SW} = \frac{n-k}{n} \geq H(U \mid Y). \quad (4)$$

Decoding: Based on the side information y and the received syndrome v, the decoder finds the most probable source sequence u in the coset $\mathcal{C}_v$, i.e., $$\hat{u} = \arg\max_{u \in \mathcal{C}_v} P(u \mid y). \quad (5)$$

This syndrome-based approach was first implemented by Pradhan and Ramchandran [23] using block codes and trellis codes. More advanced channel codes such as turbo codes are recently used for Slepian-Wolf coding [1], [14] to achieve better performance. In this work, we consider using LDPC codes for Slepian-Wolf coding [5], [17], because they not only have capacity approaching performance, but also allow flexible code designs using density evolution [26]. Another reason is that the message-passing algorithm can be applied to decoding of the LDPC codes designed for Slepian-Wolf compression with only slight modification [17]. Specifically, as in conventional message-passing algorithm, the input for the i-th variable node is the log-likelihood-ratio (LLR) of $u_i$ defined as $$L_{ch}(u_i) \triangleq \log \frac{p(Y = y_i | U = 1)}{p(Y = y_i | U = 0)}, 0 \leq i \leq n-1. \quad (6)$$

If U is uniform with P(U=1)=P(U=0)=½, we have $$L_{ch}(u_i) = \log \frac{P(U = 1 | Y = y_i)}{P(U = 0 | Y = y_i)}, 0 \leq i \leq n-1. \quad (7)$$

The j-th syndrome bit $v_j$, $0 \leq j \leq n-k-1$, is in fact the binary sum of the source bits corresponding to the ones in the j-th row of the parity-check matrix H. Hence the j-th check node in the Tanner graph is related to $v_j$. The only difference from conventional LDPC decoding is that one needs to flip the sign of the check-to-bit LLR if the corresponding syndrome bit $v_j$ is one [17].

In analyzing the performance of LDPC code based Slepian-Wolf coding, we assume that the correlation channel U→Y is memoryless and satisfies a symmetric condition called dual symmetry [5]. Under these conditions, the performance of the Slepian-Wolf code is independent of the input codeword. Hence, we can assume an all-zero input sequence u, and Slepian-Wolf decoding is exactly the same as classic LDPC decoding because the corresponding syndrome v is also an all-zero sequence. Thus conventional density evolution [26] can be employed to analyze the iterative decoding procedure without any modification.

C. High-Rate Performance Limits for SWC-TCQ

It was proven in [16, Theorem 5.2] that, for the quadratic Gaussian case with X=Y+Z, Z~N(0, $\sigma_Z^2$), the optimal distortion-rate performance of Slepian-Wolf coded nested lattice quantization for Wyner-Ziv coding using a pair of n-D nested lattices (with the fine/coarse lattice for source/channel coding) and ideal Slepian-Wolf coding at high rate is $$D_n(R) = 2\pi e G_n \sigma_Z^2 2^{-2R}, \quad (8)$$

where $G_n$ is the normalized second moment $G(\Lambda)$, minimized over all lattices $\Lambda$ in $\mathbb{R}^n$, with $$G_1 = \frac{1}{12}, G_n \geq \frac{1}{2\pi e}, \text{ and } \lim_{n \to \infty} G_n = \frac{1}{2\pi e} [9].$$

Also, the granular gain of $\Lambda$ is defined as $g_\Lambda = -10 \log_{10} 12G(\Lambda)$, which is maximally 1.53 dB.

It is also observed in [16] that the nested lattice pair in Slepian-Wolf coded nested lattice quantization degenerates to a single source coding lattice at high rate. This means Slepian-Wolf coded lattice quantization with only one lattice (for source coding), followed by ideal Slepian-Wolf coding, achieves the same performance as in (8) at high rate. This is because Slepian-Wolf coding alone can realize all the binning (or compression with side information Y at the decoder) after lattice quantization of X.

Owing to the difficulty of implementing lattice quantizers beyond 24 dimensions, TCQ is considered as the only practical means of obtaining an equivalent high-dimensional lattice quantizer. The following proposition gives the high-rate performance of SWC-TCQ.

Proposition 4.1: Assuming ideal Slepian-Wolf coding, the distortion-rate performance of SWC-TCQ for Wyner-Ziv coding in the quadratic Gaussian case with X=Y+Z, Z~N(0, $\sigma_Z^2$) is $$D(R) = 2\pi e G_{TCQ} \sigma_Z^2 2^{-2R} \quad (9)$$

at high rate, where $G_{TCQ}$ is the normalized second moment of the equivalent lattice quantizer associated with TCQ.

Since 256-state ECTCQ performs within 0.2 dB of the distortion-rate function at all rates for Gaussian sources [31] in classic source coding, the granular gain of 256-state TCQ is $g_{TCQ} = -10 \log_{10} 12G_{TCQ} = 1.53 - 0.2 = 1.33$ dB. Proposition 4.1 means that 256-state SWC-TCQ can perform $$10 \log_{10} \frac{D(R)}{D_{WZ}(R)} = 10 \log_{10} 2\pi e G_{TCQ} = 0.2 \text{ dB} \quad (10)$$

away from the Wyner-Ziv distortion-rate function $D_{WZ}(R) = \sigma_Z^2 2^{-2R}$, and this gap can be further diminished as the number of states $N_s$ in TCQ goes beyond 256.

In Section VII, the high-rate asymptotic result of (9) is shown by using trellis-coded quantizers of different number of states, starting from $N_s = 256$. Additionally, the performance of SWC-TCQ at both low and high rates is shown by designing capacity-approaching LDPC codes for Slepian-Wolf coding of the source after TCQ.

V. WYNER-ZIV CODING BASED ON TCQ AND LDPC CODES

A. Overview

Assume the source X is related to the decoder side information Y by X=Y+Z, where Y~N(0, $\sigma_Y^2$) and Z~N(0, $\sigma_Z^2$) are independent. For a target bit rate Rx b/s, we aim to minimize E{d(X, $\hat{X}$)}. A more detailed block diagram of our proposed SWC-TCQ scheme is shown in FIG. 5. The input X is grouped into blocks of length-L samples before going through an R-bit TCQ [19] in the TCQ Encoder, which employs a standard Viterbi encoder and a uniform-threshold codebook $\mathcal{D}$ with quantization stepsize size λ. The TCQ index vector b={$b_0, b_1, \ldots, b_{L-1}$} includes one trellis bit plane $b^0$ and R-1 codeword bit planes $b^1, \ldots,$ and $b^{R-1}$.

The Multilevel Slepian-Wolf Encoder corresponds to an R-level LDPC encoder defined by R parity-check matrices $H_0, \ldots, H_{R-1}$, where $H_r$, $0 \leq r \leq R-1$, corresponds to an (n, $k_r$) binary code $\mathcal{C}^r$ of rate $$R_r^{CC} = \frac{k_r}{n}.$$

For notational convenience, we assume L=n. (In our simulations, n=$10^6$, but L=$10^3$ for practical low-complexity TCQ; this means every one thousand TCQ index vectors are blocked together before Slepian-Wolf coding.) The Slepian-Wolf encoder uses $H_r$ to compress $b^r$ to a length-(n-$k_r$) syndrome vector $s^r = b^r H_r^T$, and outputs the concatenation of all R syndrome vectors $s = s^0 | s^1 | \ldots | s^{R-1}$ [5]. Owing to the variations in the compressibility of the $b^r$'s, we note that the lengths of different $s^r$'s are in general not uniform. The total length of s is $l=\Sigma_{r=0}^{R-1}(n-k_r)$, which results in the SWC-TCQ rate of $$R_X = \frac{l}{L} = \frac{l}{n} = \sum_{r=0}^{R-1} R_r^{SW} \text{ b/s}, \quad (11)$$

where $R_r^{SW}=1-R_r^{CC}$ is the rate allocated to the r-th bit plane $b^r$. We assume that s is revealed to the decoder via a noiseless channel.

At the decoder, the side information sequence $y=\{y_0, \ldots, y_{L-1}\}$ is used in conjunction with the received syndrome s to sequentially decode the bit planes of b, starting from the bottom (trellis bit) plane $b^0$. This way, when decoding the r-th bit plane $b^r$, the lower bit planes have already been reconstructed as $\hat{b}^0, \hat{b}^1, \ldots, \hat{b}^{r-1}$. Therefore, we can utilize the conditional probability $P(b^r|\hat{b}^{r-1}, \ldots, \hat{b}^1, \hat{b}^0, y)$ to reconstruct $b^r$ as $$\hat{b}^0 = \arg\max_{b^0 \in C_{s^0}^0} P(b^0 | y), \quad (12)$$

$$\hat{b}^r = \arg\max_{b^r \in C_{s^r}^r} P(b^r | \hat{b}^{r-1}, \ldots, \hat{b}^1, \hat{b}^0, y), \quad 1 \le r \le R-1,$$

where $C_{s^r}^r$ corresponds to the coset of code $C^r$ with syndrome $s^r$.

Because $b^0$ has memory (whereas all the other bit planes are sample-wise independent given $b^0$), we have to treat it differently. Specifically, we first use the Trellis Path Estimator to compute the LLR of each trellis bit $b_i^0$ with side information y, defined as $$L_{ch}(b_i^0) \triangleq \log \frac{p(y | b_i^0 = 1)}{p(y | b_i^0 = 0)} = \log \frac{P(b_i^0 = 1 | y)}{P(b_i^0 = 0 | y)}, \quad 0 \le i \le L-1, \quad (13)$$

where the second equation is due to the fact that $P(b_i^0=0)=P(b_i^0=0)=\frac{1}{2}$ (because the PDFs of the source X and the TCQ codebook $\mathcal{D}$ are both symmetric with respect to the origin). Note that we use the probabilities of $b_i^0$ given the whole side information sequence y instead of only $y_i$ because of the memory in $b^0$. Hence computations of $L_{ch}(b_i^0)$ are carried out block by block. This is done by randomly generating realizations $z'=\{z_0', z_1', \ldots, z_{L-1}'\}$ of $Z' \sim N(0, \sigma_Z^2)$, quantizing $x'=y+z'$ with the same TCQ used in the encoder, and counting the occurrences of 0's and 1's in each trellis bit $b_i^0$ to obtain $P(b_i^0=1|y)$ and $P(b_i^0=0|y)$. Although the resulting estimate of $L_{ch}(b_i^0)$ might not be optimal, experiments show that the Trellis Path Decoder performs reasonably well (except at low rate) because the conditional entropy $$\frac{1}{L} H(B^0 | Y)$$

approaches one b/s as the TCQ rate R increases, where $B_0$ is the binary random vector associated with $b^0$. With $$R_0^{SW} \ge \frac{1}{L} H(B^0 | Y)$$

approaching one b/s, it is reasonable to assume that $b^0$ can be recovered error free when decoding the R-1 higher bit planes, namely, $b^1, b^2, \ldots, b^{R-1}$.

To avoid the compression inefficiency of $b^0$ due to the suboptimality in estimating $L_{ch}(b_i^0)$, we employ TCVQ to make the rate of $b^0$ fractional when the target bit rate is low (e.g., <1 b/s). (We point out that another alternative is to perform elaborate LDPC code design for better Slepian-Wolf compression of $b^0$ based on EXIT charts [32] using the BCJR algorithm [2] at the decoder, similar to what was done in recent capacity-approaching code designs [10], [30] for the dirty paper coding problem [7].) In this case, $b^0$ is directly sent to the decoder without compression. Details about TCVQ-based Wyner-Ziv coding are given in Section VI.

With $\hat{b}^0$ available at the decoder, the coset index vector c of the trellis T in TCQ can be reconstructed as $\hat{c}=T(\hat{b}^0)$. Because all the codeword bit planes of b are sample-wise independent given $b^0$, computation in the Codeword Bits Estimator can be sample based instead of block based. In Section V-B, we extract key information from TCQ, which captures the statistical relationship between the source and the quantization indices. Based on this statistics, we devise in Section V-C a novel way of computing the LLR, defined as $$L_{ch}(b_i^r) \triangleq \log \frac{p(\hat{b}_i^{r-1}, \ldots, \hat{b}_i^2, \hat{b}_i^1, \hat{c}_i, y_i | b_i^r = 1)}{p(\hat{b}_i^{r-1}, \ldots, \hat{b}_i^2, \hat{b}_i^1, \hat{c}_i, y_i | b_i^r = 0)} \quad (14)$$

$$= \log \frac{P(b_i^r = 1 | \hat{b}_i^{r-1}, \ldots, \hat{b}_i^2, \hat{b}_i^1, \hat{c}_i, y_i)}{P(b_i^r = 0 | \hat{b}_i^{r-1}, \ldots, \hat{b}_i^2, \hat{b}_i^1, \hat{c}_i, y_i)} \text{ for}$$

$$1 \le r \le R-1, \quad 0 \le i \le L-1,$$

for each codeword bit $b_i^r$, given $\{\hat{b}_i^{r-1}, \ldots, \hat{b}_i^2, \hat{b}_i^1, \hat{c}_i, y_i\}$ as decoder side information. Again the second equation in (14) comes from $P(b_i^r=1)=P(b_i^r=0)=\frac{1}{2}$.

Using this LLR, the Codeword Bits Decoder sequentially reconstructs $b^1, b^2, \ldots, b^{R-1}$ (hence the full b) based on the side information y and the received syndrome vectors $s^1, s^2, \ldots, s^{R-1}$.

Finally, the Joint Estimator jointly reconstructs $\hat{x}=E\{X|\hat{b}, y\}$ from both $\hat{b}$ and y at the decoder. The estimator used in [6], [23] is linear, which is good only when the quantization error $X-\hat{X}$ is a sequence of independent Gaussian random variables [43]. However, we know from classic source coding [15] that this is true only when the source code achieves the rate-distortion bound, which requires infinite-dimensional vector quantizers. Although TCQ is an efficient quantization technique, its quantization error is still not Gaussian, especially when the TCQ rate R is low. Using results developed in Section V-B again, we describe a universal method of performing optimal non-linear estimation in Section V-D.

B. Statistics of TCQ Indices

Assume that $R_0^{SW}$ is close to one b/s such that the trellis bit vector $b^0$ and hence the TCQ coset index vector c is perfectly known at the decoder, i.e., $\hat{b}^0=b^0$ and $\hat{c}=c$, we need to find the probabilities $P_{C_i W_i | Y_i}(c_i, w_i | y_i)$ (or $P(c_i, w_i | y_i)$ in short) for all the $2^{R-1}$ possible values of $w_i$ to compute $L_{ch}(b_i^r)$ defined in (14), since $P(c_i, w_i|y_i)$ fully determines $P(b_i^r=1|b_i^{r-1}, \ldots, b_i^2, b_i^1, \hat{c}_i, y_i)$ $1 \leq r \leq R-1$. Because the Markov chain $\{C_i, W_i\} \to X_i \to Y_i$ holds for any $0 \leq i \leq L-1$, and the correlation between $X_i$ and $Y_i$ is already known, the key problem then becomes how to model the correlation between $\{C_i, W_i\}$ and $X_i$. Toward this end, we look into the conditional probability $P(c_i, w_i|x_i)$, which can be interpreted as the probability that $x_i$ is quantized to codeword $q_{c_i}^{w_i}$. This conditional probability makes the connection between the input and output of TCQ, and characterizes the essence of the quantization process. Recall from (3) that at each stage in the Viterbi algorithm of TCQ, $w_i$ is a deterministic function of $x_i$ and $c_i$, namely, $w_i = \mathcal{W}(x_i, c_i) = \arg\min_{0 \leq w \leq 2^{R-1}-1} \|x_i - q_{c_i}^w\|^2$. Then $P(c_i, w_i|x_i) = P(c_i|x_i)I(w_i = \mathcal{W}(x_i, c_i))$, where $I(\cdot)$ is the indicator function, taking value one if its argument is true, and zero otherwise. Hence we only need to look into the conditional probabilities $P_{C_i|X_i}(c_i|x_i)$ (or $P(c_i|x_i)$ in short).

However, it is very hard to determine $P(c_i|x_i)$ analytically, because TCQ implements an equivalent high-dimensional vector quantizer. Moreover, $P(c_i|x_i)$ varies with index i, since the Viterbi algorithm suffers from a state "start-up" problem. This means the $P(c_i|x_i)$'s for small i's differ from those for large i's (after the trellis is fully developed). The length of this start-up procedure is closely related to the TCQ's memory size $\log_2(N_s)$. Fortunately, practical TCQ usually has block length $L \gg \log_2(N_s)$. Thus the subscript i in $P(c_i|x_i)$ can be dropped without much penalty by assuming $P(c_i|x_i) \equiv P(c|x)$ for all i. Hence we can use the empirical statistics between C and X to approximate $P(c|x)$.

Since X is continuously valued, we first choose a real number A>0 such that $P(X \notin [-A, A]) < \epsilon$, and partition the range $[-A, A]$ into M length-$\delta$ mini-cells, $\Delta_1, \Delta_2, \ldots, \Delta_M$, with $$\delta = \frac{2A}{M}.$$

Define $\Delta_0 = (-\infty, -A)$ and $\Delta_{M+1} = (A, \infty)$, also denote $t_m$ as the mid-point of $\Delta_m$ for $1 \leq m \leq M$, and $t_0 = -A$, $t_{M+1} = A$. This partition procedure is illustrated in FIG. 6.

The conditional probability $P(c|x)$ can then be approximated by $P(c|x \in \Delta_m)$ as $\epsilon \to 0$ and $M \to \infty$, where $\Delta_m$ is the mini-cell containing x. We thus have $$P(c|x) \approx P(c|x \in \Delta_m) \approx \lim_{L \to \infty} \frac{\sum_{i=0}^{L-1} I(c_i = c, x_i \in \Delta_m)}{\sum_{i=0}^{L-1} I(x_i \in \Delta_m)}. \quad (15)$$

To compute the statistics in (15), Monte Carlo simulations are run for TCQ on the training data drawn from $X \to N(0, \sigma_X^2)$. We count the number of occurrences for each possible input-output pair $\{(m, c): x_i \in \Delta_m, c_i = C\}$. Let count (m, c) be the number of occurrences corresponding to the (m, c) pair, then the desired probability becomes $$P(c|x \in \Delta_m) = \frac{P(c, x \in \Delta_m)}{P(x \in \Delta_m)} \approx \frac{\text{count}(m, c)}{\sum_{c'=0}^{3} \text{count}(m, c')}. \quad (16)$$

Note that when $\delta \to 0$, we can assume that $\mathcal{W}(x, c) = \mathcal{W}(t_m, c)$ for all $x \in \Delta_m$, then $P(w, c|x \in \Delta_m) = P(c|x \in \Delta_m)I(w = \mathcal{W}(t_m, c))$. In addition, the value of the conditional probability $P(c|x \in \Delta_m)$, $0 \leq m \leq M+1$, $0 \leq c \leq 3$, can be shared by both the encoder and the decoder using a look-up table.

We can also estimate the conditional PDF $f_{X|W,C}(x|w, c)$ (or $f(x|w, c)$) based on count(m, c), $0 \leq m \leq M+1$, $0 \leq c \leq 3$, because this conditional PDF can be approximated by $$\frac{1}{\delta} P(x \in \Delta_m | \omega, c)$$

when $\delta$ is very small. This means for $x \in \Delta_m$, $$\begin{aligned}
f(x|c, w) &\approx \frac{1}{\delta} P(x \in \Delta_m | c, w) \\
&= \frac{1}{\delta} \frac{P(x \in \Delta_m, c, w)}{P(c, w)} \\
&= \frac{1}{\delta} \frac{I(w = \mathcal{W}(x, c)) P(c, x \in \Delta_m)}{\sum_{m'} P(c, w, x \in \Delta_{m'})} \\
&= \frac{1}{\delta} \frac{I(w = \mathcal{W}(x, c)) P(c, x \in \Delta_m)}{\sum_{m'} I(w = \mathcal{W}(x, c)) P(c, x \in \Delta_{m'})} \\
&= \frac{1}{\delta} \frac{I(w = \mathcal{W}(x, c)) P(c, x \in \Delta_m)}{\sum_{m' \mathcal{W}(t_{m'}, c) = w} P(c, x \in \Delta_{m'})} \\
&\approx \frac{1}{\delta} I(w = \mathcal{W}(x, c)) \frac{\text{count}(m, c)}{\sum_{m' \mathcal{W}(t_{m'}, c) = w} \text{count}(m', c)}.
\end{aligned} \quad (17)$$

This PDF is actually the conditional distribution of the TCQ input, given that it is quantized to $q_c^w$. From FIG. 7, we can clearly see the non-Gaussian shape of $f(x|c, w)$ for the boundary cells of a 2-bit TCQ.

C. Multilevel Slepian-Wolf Coding

The goal of multilevel Slepian-Wolf coding is to approach the conditional entropy $$H(Q(X)|Y) = \frac{1}{L} H(B|Y) b/s.$$

Because b is a vector of L elements, each with R-bit resolution, we can use the chain rule on $H(B|Y)$ to get $$\begin{aligned}
\frac{1}{L} H(B|Y) &= \frac{1}{L}[H(B^0|Y) + H(B^1|B^0, Y) + \ldots + \\
&\quad H(B^{R-1}|B^{R-2}, \ldots, B^2, B^1, B^0, Y)]
\end{aligned} \quad (18)$$

$$= \frac{1}{L}\left[H(B^0|Y) + \sum_{i=0}^{L-1} H(B_i^1|C_i, Y_i) + \ldots + \sum_{i=0}^{L-1} H(B_i^{R-1}|B_i^{R-2}, \ldots, B_i^2, B_i^1, C_i, Y_i)\right] \quad (19)$$

$$\stackrel{(a)}{\approx} \frac{1}{L} H(B^0|Y) + H(B^1|C, Y) + \ldots + H(B^{R-1}|B^{R-2}, \ldots, B^2, B^1, C, Y), \quad (20)$$

where $B^r$ is the binary random vector associated with bit plane $b^r$ of b, and (a) is true if we drop the subscript i by assuming that the conditional entropies are invariant among samples, i.e., $H(B_i^{r-1}|B_i^{r-2}, \ldots, B_i^2, B_i^1, C_i, Y_i) \equiv H(B^r|B^{r-1}, \ldots, B^2, B^1, C, Y)$ for all $0 \leq i \leq L-1$, $2 \leq r \leq R-1$. Thus the zeroth and first level Slepian-Wolf encoders are designed to approach the conditional entropies $$\frac{1}{L}H(B^0|Y) \text{ and } H(B^1|C, Y),$$

respectively, while the r-th level ($2 \leq r \leq R-1$) Slepian-Wolf encoder targets at rate $H(B^r|B^{r-1}, \ldots, B^2, B^1, C, Y)$. This is illustrated in FIG. 8.

To measure the conditional entropy $H(B^r|B^{r-1}, \ldots, B^2, B_1, C, Y)$, we first need to find the conditional probabilities $P(c_i, w_i|y_i)$, $0 \leq i \leq L-1$. As mentioned in Section V-B, using the Markov chains $\{C_i, W_i\} \to X_i \to Y_i$, $P(c_i, w_i|y_i)$ can be computed via the conditional probabilities $P(c|x \in \Delta_m)$ in (16), then $$P(c_i, w_i | y_i) = \sum_{m=0}^{M+1} P(c_i, w_i, x_i \in \Delta_m | y_i) \quad (21)$$

$$= \sum_{m=0}^{M+1} P(c_i, w_i | x_i \in \Delta_m) P(x_i \in \Delta_m | y_i)$$

$$= \sum_{m=0}^{M+1} P(c_i | x_i \in \Delta_m) I(w_i = W(t_m, c_i)) \int_{\Delta_m} f_Z(x - y_i) dx$$

$$\approx \delta \sum_{m: W(t_m, c_i) = w_i} P(c_i | x_i \in \Delta_m) f_Z(t_m - y_i).$$

In (21), we have set $x_i$ to $t_m$ and the PDF $f_Z(x-y_i)$ to $f_Z(t_m-y_i)$ when $x \in \Delta_m$. This approximation is accurate only for large M. Our experiments show that the SNR gain in MSE of $M=5 \times 10^3$ over $M=10^3$ is only 0.02 dB. Thus we set $M=10^3$ throughout our simulations. Note that $P(c_i|x_i \in \Delta_m)$ in (21) comes from the look-up table indexed by $(m, c_i)$. Another table for the exponential function in $f_Z(z)$ can also be used to speed up the computation.

Then the conditional entropy $H(B^r|B^{r-1}, \ldots, B^2, B^1, C, Y)$ can be computed as $$H(B^r | B^{r-1}, \ldots, B^2, B^1, C, Y) = E_{B^r, B^{r-1}, \ldots, B^2, B^1, C, Y}\left\{\log_2 \frac{1}{P(B^r | B^{r-1}, \ldots, B^2, B^1, C, Y)}\right\} \quad (22)$$

$$= E_{B^{r-1}, \ldots, B^2, B^1, C, Y}\{\mathcal{H}(P(B^r = 1 | B^{r-1}, \ldots, B^2, B^1, C, Y))\}$$

$$\approx \lim_{L \to \infty} \frac{1}{L} \sum_{i=0}^{L-1} \mathcal{H}\left(P(B_i^r = 1 | \hat{b}_i^{r-1}, \ldots, \hat{b}_i^2, \hat{b}_i^1, \hat{c}_i, y_i)\right)$$

$$= \lim_{L \to \infty} \frac{1}{L} \sum_{i=0}^{L-1} \mathcal{H}\left(\frac{\sum_{0 \leq w \leq 2^{R-1}-1} I(b^r = 1, b^{r-1} = \hat{b}_i^{r-1}, \ldots, b^2 = \hat{b}_i^2, b^1 = \hat{b}_i^1) P(\hat{c}_i, w | y_i)}{\sum_{0 \leq w \leq 2^{R-1}-1} I(b^{r-1} = \hat{b}_i^{r-1}, \ldots, b^2 = \hat{b}_i^2, b^1 = \hat{b}_i^1) P(\hat{c}_i, w | y_i)}\right),$$

where $$\mathcal{H}(p) = p \log_2 \frac{1}{p} + (1-p) \log_2 \frac{1}{1-p}.$$

Since both the encoder and the decoder know the joint distribution of X and Y, the above conditional entropy $H(B^r|B^{r-1}, \ldots, B^2, B^1, C, Y)$ is computed off-line—at both the encoder and decoder—by randomly generating realizations of $Y' \sim N(0, \sigma_Y^2)$ and $Z' \sim N(0, \sigma_Z^2)$ before quantizing $X' = Y' + Z'$ with TCQ and invoking (22).

Finally, based on the probabilities $P(c_i, w_i|y_i)$, the Codeword Bits Estimator computes $L_{ch}(b_i^r)$ defined in (14) using the fact that $$L_{ch}(b_i^r) = \log \frac{P(b_i^r = 1 | \hat{b}_i^{r-1}, \ldots, \hat{b}_i^2, \hat{b}_i^1, \hat{c}_i, y_i)}{P(b_i^r = 0 | \hat{b}_i^{r-1}, \ldots, \hat{b}_i^2, \hat{b}_i^1, \hat{c}_i, y_i)} \quad (23)$$

$$= \log \frac{\sum_{0 \leq w \leq 2^{R-1}-1} I(b^r = 1, b^{r-1} = \hat{b}_i^{r-1}, \ldots, b^2 = \hat{b}_i^2, b^1 = \hat{b}_i^1) P(\hat{c}_i, w | y_i)}{\sum_{0 \leq w \leq 2^{R-1}-1} I(b^r = 0, b^{r-1} = \hat{b}_i^{r-1}, \ldots, b^2 = \hat{b}_i^2, b^1 = \hat{b}_i^1) P(\hat{c}_i, w | y_i)},$$

where $b^r, \ldots, b^2, b^1$ come from the binary representation $b^{R-1} \ldots b^2 b^1$ of w.

1) *Special treatment for the trellis bits:* Owing to the memory in the trellis bits in $b^0$, we cannot directly apply the LDPC code based Slepian-Wolf coding for its compression. One solution requires elaborate EXIT chart based code design [32]; another is to partition the trellis bits in $b^0$ into small blocks and only consider the memory within each block. For example, we can partition each length-L trellis bit vector into $$\frac{L}{5}$$

length-5 blocks and treat them as i.i.d. 5-bit symbols. The correlation between these 5-bit symbols and the side information Y can be simulated by randomly generating realizations of $Z' \sim N(0, \sigma_Z^2)$, quantizing $Y+Z'$ with the same TCQ used in the encoder, and counting the number of occurrences of each symbol. However, this approach is suboptimal and its performance unsatisfactory. Fortunately, when the TCQ rate R is high so that $R_X > 1$ b/s, the conditional entropy of the trellis bits is almost one b/s, hence Slepian-Wolf compression does not help and we can directly send $b^0$. When the target rate Rx is very low (e.g., <1 b/s), we introduce TCVQ to make the rate for the trellis bits fractional and again send $b^0$ directly without SWC.

2) Slepian-Wolf coding of TCQ codeword bit planes: Due to the nature of the Viterbi algorithm employed by TCQ, given the trellis bits $b^0$, TCQ only involves additional (R-1)-bit scalar quantization, which is memoryless. Thus the "hypothetical" correlation channel between each TCQ codeword bit plane $b^r$, $1 \leq r \leq R-1$, and the side information Y is also memoryless. However, these hypothetical channels are not AWGN. To analyze these channels, we assume that $\{b_i^r, 0 \leq i \leq L-1\}$ and $\{L_{ch}(b_i^r), 0 \leq i \leq L-1\}$ are independent drawings of random variables $B^r$ and $L^r$, respectively. Then the conditional PDFs $f_{L^r|B^r}(l|0)$ and $f_{L^r|B^r}(l|1)$ are evaluated experimentally. An example of the resulting PDFs are plotted in FIG. 9.

Nevertheless, it is seen from FIG. 9 that the conditional PDFs satisfies $$f_{L^r|B^r}(l|0) = f_{L^r|B^r}(-l|1), \quad (24)$$

i.e., the channel between $B^r$ and $L^r$ is sign-symmetric. According to [5], this sign-symmetry ensures that density evolution can be used to design capacity-approaching LDPC codes for these hypothetical channels in compressing $b^1$ to $H(B^1|C, Y)$ b/s and $b^r$ to $H(B^r|B^{r-1}, \ldots, B^2, B^1, C, Y)$ b/s for $2 \leq r \leq R-1$.

In our simulations, we employ density evolution in conjunction with differential evolution—an efficient global optimization algorithm—to design LDPC codes for these hypothetical correlation channels (e.g., by feeding the channel LLR distribution in FIG. 9 to the density evolution algorithm). The resulting LDPC codes give Slepian-Wolf coding performance that are close to the compression limits, with the compression loss staying within 0.03 b/s for each TCQ codeword bit plane $b^r$, $1 \leq r \leq R-1$ (with the probability of error under $10^{-6}$).

D. Minimum MSE Estimation

Based on the conditional probabilities $P(c|x \in \Delta_m)$ defined in (16), we first derive the conditional probabilities $$P(x_i \in \Delta_m | c_i, w_i, y_i) = \frac{P(x_i \in \Delta_m, c_i, w_i | y_i)}{P(c_i, w_i | y_i)} \quad (25)$$

$$\stackrel{(a)}{\approx} \frac{P(c_i, w_i | x_i \in \Delta_m) P(x_i \in \Delta_m | y_i)}{P(c_i, w_i | y_i)}$$

$$\stackrel{(b)}{\approx} \frac{I(w_i = W(t_m, c_i)) P(c_i | x_i \in \Delta_m) f_Z(t_m - y_i)}{\sum_{m:W(t_m, c_i) = w_i} P(c_i | x_i \in \Delta_m) f_Z(t_m - y_i)},$$

where (a) is due to the Markov chain $\{C_i, W_i\} \to X_i \to Y_i$ and (b) is from (21). Then the optimal estimator is $$\hat{x}_i = E\{X_i | c_i, w_i, y_i\}$$

$$= \sum_{m=0}^{M+1} E\{X_i | x_i \in \Delta_m, c_i, w_i, y_i\} P(x_i \in \Delta_m | c_i, w_i, y_i) \quad (26)$$

$$\approx \sum_{m=0}^{M+1} t_m P(x_i \in \Delta_m | c_i, w_i, y_i) \quad (27)$$

$$\approx \sum_{m=0}^{M+1} t_m \frac{I(w_i = W(t_m, c_i)) P(c_i | x_i \in \Delta_m) f_Z(t_m - y_i)}{\sum_{m:W(t_m, c_i) = w_i} P(c_i | x_i \in \Delta_m) f_Z(t_m - y_i)}. \quad (28)$$

The estimator in (28) is non-linear in general and universal as it does not assume Gaussianity of the quantization error $\hat{X} - X$ or independence of X and Z. It works well even if the noise Z is not Gaussian, because the distribution of Z is involved in (28). It also outperforms the estimator in [23] which linearly combines $E\{X|b\}$ and y, especially at low rate (see results in Table III shown in FIG. 14). The linear estimator [23] is defined as $$\hat{X} = \frac{\sigma_Z^2}{\sigma_q^2 + \sigma_Z^2} W + \frac{\sigma_q^2}{\sigma_q^2 + \sigma_Z^2} Y, \quad (29)$$

where W is the quantized version of the source X, and $\sigma_q^2$ is defined as $$\sigma_q^2 = \frac{1}{L} E\{\|X - W\|^2\}.$$

VI. WYNER-ZIV CODING BASED ON TCVQ AND LDPC CODES

To reduce the inefficiency of coding the trellis bit vector $b^0$ with SWC-TCQ, we employ k-D TCVQ [11] so that the rate for $b^0$ is $$\frac{1}{k} b/s.$$

This leads to a Slepian-Wolf coded TCVQ (SWC-TCVQ) scheme for Wyner-Ziv coding, in which $b^0$ is directly transmitted without compression. Although this is still a suboptimal solution, the rate loss due to not compressing $b^0$ is k times smaller than that in the SWC-TCQ case. However, it is very difficult to model the statistics of the TCVQ indices because the number of independent statistical cells is roughly $M^k$, which increases exponentially with the dimensionality k (cf. FIG. 6). Hence we only use a suboptimal class of TCVQ with cubic lattice codebooks and $2^k$ equally partitioned cosets in the sense that there are two cosets in each dimension. This way, the k-D joint statistics of TCVQ indices can be factored into k 1-D statistics, which can be collected just as in the TCQ case.

A. Trellis-Coded Vector Quantization (TCVQ)

We consider a subclass of k-D TCVQ with cubic lattice codebook $\mathcal{D}$ defined by the k-fold direct product of a 1-D uniform codebook $\mathcal{D}$, which is of size $2^{R+1}$ with quantization stepsize $\lambda$. We partition $\mathcal{D}$ into two cosets $\mathcal{D}_0$ and $\mathcal{D}_1$, each with $2^R$ codewords. For any length-k binary vector $c = \{c^1, c^2, \ldots, c^k\}^T$, define $\mathcal{D}_C = \mathcal{D}_{c^1} \times \mathcal{D}_{c^2} \times \ldots \times \mathcal{D}_{c^k}$. This way, the size $2^{k(R+1)}$ cubic lattice codebook $\mathcal{D}$ is equally partitioned into $2^k$ cosets, each indexed by a binary vector c. We denote a k-D code vector in $\mathcal{D}$ as $q_c^\omega = \{q_{c^1}^{w^1}, q_{c^2}^{w^2}, \ldots, q_{c^k}^{w^k}\}$, where c is the coset index vector, $w^j = \{b^{(j,R)}, b^{(j,R-1)}, \ldots, b^{(j,1)}\}^T$ the length-R codeword index vector in the j-th dimension, and $\omega = \{w^1, w^2, \ldots, w^k\}$ the R×k codeword index matrix. Define a coset mapping $\mathbf{M}: \{0, 1\}^k \to \{0, 1\}^k$, which is a bijective from a length-k index vector to another length-k index vector.

A length-L trellis T is defined by a rate $$\frac{1}{k}$$

convolutional code, which is designed to maximize the free distance with respect to the partition $\mathcal{D} = \cup_C \mathcal{D}_C$ [33]. The input to the trellis T is a length-L binary vector $b^0$, and the corresponding output is a length-kL binary vector $v = \mathbf{T}(b^0)$. Unlike TCQ, the output vector v is then relabeled by a coset mapping M, and the resulting length-kL binary vector $c = \{c_0, c_1, \ldots, c_{L-1}\} = \{\mathbf{M}(\mathbf{T}_0(b^0)), \ldots, \mathbf{M}(\mathbf{T}_{L-1}(b^0))\}$ is called the coset index vector. We denote the j-th bit of the i-th coset index as $c_i^j = \mathbf{M}^j(\mathbf{T}(b^0))$, $1 \leq j \leq k$, $0 \leq i \leq L-1$. The coset mappings M used in the specification are (in their hexadecimal forms):

$$\mathbf{M}: \{0,1,2,3\} \to \{0,1,3,2\} \text{ for 2-dimensional TCVQ}; \quad (30)$$

$$\mathbf{M}: \{0, \ldots, F\} \to \{0,1,3,2,4,5,7,6,8,9,B,A,C,D,F,E\} \text{ for 4-dimensional TCVQ}. \quad (31)$$

In TCVQ, a sequence of kL input source samples is grouped into L k-D source vectors $\{x_0, x_1, \ldots, x_{L-1}\}$ with $x_i = \{x_i^1, x_i^2, \ldots, x_i^k\}^T$, $0 \leq i \leq L-1$, before being quantized by TCVQ using the following two functions $$b^0 = \arg\min_{a \in \{0,1\}^L} \sum_{i=0}^{L-1} \min_{\omega \in \{0,1\}^{R \times k}} \left\| x_i - q_{\mathbf{M}(\mathbf{T}_i(a))}^\omega \right\|^2 = \arg\min_{a \in \{0,1\}^L} \sum_{i=0}^{L-1} \sum_{j=1}^{k} \min_{w^j \in \{0,1\}^R} \left\| x_i^j - q_{\mathbf{M}^j(\mathbf{T}_i(a))}^{w^j} \right\|^2 \quad (32)$$

$$\omega_i \triangleq W(x_i, c_i) = W(x_i, \mathbf{M}(\mathbf{T}_i(b^0))) = \arg\min_{\omega \in \{0,1\}^{R \times k}} \|x_i - q_{C_i}^\omega\|^2, \quad (33)$$

for $0 \leq i \leq L-1$, yielding $$w_i^j = W^j(x_i^j, c_i^j) = \arg\min_{w^j \in \{0,1\}^R} \left\| x_i^j - q_{c_i^j}^{w^j} \right\|^2, \quad (34)$$

for $1 \leq j \leq k$, $0 \leq i \leq L-1$.

Finally, it combines the trellis bit vector $b_0$ and the codeword index vector $\{\omega_0, \ldots, \omega_{L-1}\}$ as the output index vector b, achieving a quantization rate of $$\frac{kR+1}{k} = R + \frac{1}{k} \text{ b/s},$$

with $$\frac{1}{k}$$

b/s spent on $b^0$.

In our SWC-TCVQ simulations, we employ Slepian-Wolf coding after 2-D and 4-D TCVQs for low-rate Wyner-Ziv coding. That is, k=2 or 4. The convolutional codes used in our TCVQ simulation are given in Table I (see FIG. 10). All the convolutional codes are non-recursive and defined by polynomials $h_i$, i=0, 1, 2, 3, displayed in octal form. To measure the efficiency of TCVQ, we evaluate its equivalent granular gain, showing 1.27 dB and 1.22 dB for 2-D and 4-D TCVQ, respectively. These numbers are also included in Table I (see FIG. 10). They are smaller than the 1.33 dB granular gain with 256-state TCQ because non-optimal cubic lattice codebooks are used in our TCVQ simulations for the sake of simplicity. In addition, we see that the non-optimality of using a cubic lattice codebook is more pronounced in 4-D TCVQ than 2-D TCVQ.

B. Statistics of k-D TCVQ

Using the suboptimal class of k-D TCVQ described Section VI-A, the joint PDF P(c|x) can be expressed by the k-fold product of the marginal PDF in each dimension, i.e., $$P(c \mid x) = \prod_{j=1}^{k} P(c^j \mid x^j). \quad (35)$$

In addition, a cubic lattice codebook means the marginal PDFs for different dimensions are identical with $P(c^j|x^j) = P(c|x)$. We can thus use the method described in Section V-B to empirically compute the probabilities $P(c|x \in \Delta_m)$. Similar to the TCQ case, we plot the conditional PDFs f(x|c, w) for both 2-D and 4-D TCVQ in FIG. 11. Note that the PDFs are for non-boundary codewords $q_c^w$, and are normalized into their non-zero range $x \in [q_x^w - \lambda, q_c^w + \lambda]$. The quantization noise $x - q^{cw}$ deviates more from the Gaussian shape for 4-D TCVQ than 2-D TCVQ—a reflection that the former has smaller granular gain. The non-Gaussian shape of the quantization error necessitates the use of optimal non-linear estimation in (28).

VII. EXPERIMENTAL RESULTS

A. SWC-TCQ

Assuming the source X and the decoder side information Y are related by X=Y+Z, with Y~N(0, 1) and Z~N(0, 0.28), extensive simulations have been carried out to evaluate our proposed SWC-TCQ scheme for Wyner-Ziv coding of X.

Using a 256-state TCQ and assuming ideal Slepian-Wolf coding with rate computed from $$H(Q(X) \mid Y) = \frac{1}{L} H(B \mid Y),$$

we find out that SWC-TCQ performs 0.2 dB away from $D_{WZ}(R)$ at high rate (e.g. 3.74 b/s), and that SWC-TCQ in conjunction with optimal non-linear estimation (28) performs 0.67 dB away from $D_{WZ}(R)$ at low rate (e.g., 0.97 b/s). With practical Slepian-Wolf coding based on irregular LDPC codes of length $10^6$ bits, our SWC-TCQ coder performs 0.81 dB away from $D_{WZ}(R)$ at 3.84 b/s and 1.46 dB away from $D_{WZ}(R)$ at 1.1 b/s. These results are depicted in FIG. 12 (a). The bit error rate of our practical Slepian-Wolf decoder is less than $10^{-6}$ in all experiments, and the errors are accounted for in our reported MSE distortion.

Since the granular gain $g_{TCQ}$ of TCQ increases with the number of states going beyond 256 [31], we have implemented TCQ with up to 65,536 states (with $g_{TCQ}$=1.455 dB). The rate-½ convolutional codes defined by the octal form polynomials $h_0$ and $h_1$ with the number of states ranging from 4 to 65,536 are given in Table 13, together with the resulting granular gains. Our polynomials are searched to maximize the granular gain $g_{TCQ}$, showing differences in some cases from those in [33, Table 1][34], which are obtained by maximizing the free distance and only include codes up to 2,048 states.

Using a 8,192-state TCQ and assuming ideal Slepian-Wolf coding with rate computed from $$H(Q(X)|Y) = \frac{1}{L} H(B|Y),$$

we find out that SWC-TCQ performs 0.1 dB away from $D_{WZ}(R)$ at high rate (e.g., 3.82 b/s), and that SWC-TCQ in conjunction with optimal estimation (28) performs 0.58 dB away from $D_{WZ}(R)$ at low rate (e.g., 0.99 b/s). With practical Slepian-Wolf coding based on irregular LDPC codes of length $10^6$ bits, our SWC-TCQ coder performs 0.20 dB away from $D_{WZ}(R)$ at 3.83 b/s and 0.93 dB away from $D_{WZ}(R)$ at 1.05 b/s. These results are shown in FIG. 12 (b).

Numerical comparisons between optimal linear estimation and non-linear estimation (28) at the SWC-TCQ decoder are given in Table III (see FIG. 14). The source correlation model is X=Y+Z, with Y~N(0, 1) and Z~N(0, 0.28). These results confirm the superiority of optimal non-linear estimation. We see that the improvement of optimal non-linear estimation over optimal linear estimation decreases as the rate increases. This indicates that the non-linear estimator is degenerating to the optimal linear estimator as the rate increases.

B. SWC-TCVQ

Assuming the source X and the decoder side information Y are related by X=Y+Z, with Y~N(0, 1) and Z~N(0, 0.1), we also have run extensive simulations to evaluate our proposed SWC-TCVQ scheme for Wyner-Ziv coding of X.

Using a 256-state 2-D TCVQ and assuming ideal Slepian-Wolf coding with rate computed from $$\frac{1}{2L} H(B|Y),$$

we find out that SWC-TCVQ performs 0.26 dB away from $D_{WZ}(R)$ at high rate (e.g., 3.29 b/s), and that SWC-TCVQ in conjunction with optimal non-linear estimation (28) performs 0.38 dB away from $D_{WZ}(R)$ at low rate (e.g., 0.95 b/s). With practical Slepian-Wolf coding based on irregular LDPC codes of length $10^6$ bits, our SWC-TCVQ coder performs 0.47 dB, 0.52 dB, 0.54 dB and 0.66 dB away from $D_{WZ}(R)$ at 3.32 b/s, 2.33 b/s, 1.53 b/s, and 1.0 b/s, respectively. These results are plotted in FIG. 15 (a).

To achieve even lower rate, we also implemented Slepian-Wolf coded 4-D TCVQ. Using a 256-state 4-D TCVQ and assuming ideal Slepian-Wolf coding with rate computed from $$\frac{1}{4L} H(B|Y),$$

SWC-TCVQ performs 0.32 dB away from $D_{WZ}(R)$ at high rate (e.g., 2.01 b/s), and together with optimal non-linear estimation (28), it performs 0.69 dB away from $D_{WZ}(R)$ at 0.48 b/s. With practical Slepian-Wolf coding based on irregular LDPC codes of length $10^6$ bits, our SWC-TCVQ coder performs 0.51 dB, 0.51 dB, 0.54 dB, and 0.80 dB away from $D_{WZ}(R)$ at 2.04 b/s, 1.38 b/s, 1.0 b/s, and 0.5 b/s, respectively. These results are given in FIG. 15 (b).

Finally, Table IV (see FIG. 16) highlights the gains obtained by optimal non-linear estimation (28) over optimal linear estimation. The source correlation model is X=Y+Z, with Y~N(0, 1) and Z~N(0, 0.1). Again we see that the advantage of non-linear estimation decreases as the rate increases.

VIII. TRELLIS CODED QUANTIZER DESIGN

A. More Details on Trellis Coded Quantizer

Suppose we need to quantize a continuous source X using rate R bit per sample. A trellis coded quantizer is defined by the following two elements:

1) A codebook $\mathcal{D}$ of size $2^{R+\tilde{R}}$, which is partitioned into $2^{\tilde{R}+1}$ subsets, each having $2^{R-1}$ codewords. Normally, $\tilde{R}$ is set to 1, hence there are four subsets, which can be labeled as $\mathcal{D}_1, \mathcal{D}_2, \mathcal{D}_3, \mathcal{D}_4$. An example is shown in FIG. 4, where R=2, $\tilde{R}$=1. As in Section IV, the codewords are denoted as $q_c^w$, c=0, 1, 2, 3, w=0, 1, ..., $2^{R-1}-1$.

2) A rate $$\frac{\tilde{R}}{\tilde{R}+1}$$

binary convolutional code $\mathcal{C}$, which is defined by R+1 binary polynomials. When R=1, $\mathcal{C}$ is of rate ½ and is defined by two polynomials ($h_0$, $h_1$). Normally, these polynomials appear in their octal forms for simplicity reason. For example, if we write ($h_0$, $h_1$)=(5, 2)$_8$=(101, 010)$_2$, this means the convolutional code $\mathcal{C}$ is defined by a generator matrix $$(1 \times D^0 + 0 \times D^1 + 1 \times D^2, 0 \times D^0 + 1 \times D^1 + 0 \times D^2) = (1+D^2, D). \quad (36)$$

The equivalent realization of $\mathcal{C}$ is shown in FIG. 17. We can see that there are two delay units "D" in the realization, hence we say $\mathcal{C}$ is a "memory-2" or "4-state" convolutional code.

Trellis coded quantization is an equivalent high-dimensional vector quantization, which operates on a block of source samples $x^n = \{x_1, x_2, ..., x_n\}$ It searches in the n-dimensional vector codebook $\lambda \mathcal{DC} = \{(q_{c_1}^{w_1}, q_{c_2}^{w_2}, ..., q_{c_n}^{w_n}) \in \mathcal{D}^n$: the binary representation of $(c_1, ..., c_n)$ is a valid codeword of $\mathcal{C}\}$ for the element $\hat{x}^n = \mathcal{Q} \mathcal{DC}_{(x^n)}$ that is closest (in Euclidean distance) to the source vector $x^n$. Due to the nature of convolutional codes, the searching process can be efficiently implemented by the Viterbi algorithm. Details are given in Section IV.

B. Trellis Coded Quantizer Design

To measure the performance of a trellis coded quantizer determined by $(\mathcal{D}, \mathcal{C})$, we need to introduce the concept of granular gain $g(\Lambda \mathcal{D}, \mathcal{C})$, which is defined by $$g(\Lambda \mathcal{D}, \mathcal{C}) = -10 \log_{10} 12 G(\Lambda \mathcal{D}, \mathcal{C}), \quad (37)$$

where $G(\Lambda \mathcal{D}, \mathcal{C})$ is the normalized second moment of the basic Voronoi cell $\mathcal{V}_0 = \{x'' \in X^2 : \mathcal{QCD}(x'') = 0\}$. Note that the term "granular gain" is originally defined for lattice quantizers, whose Voronoi regions are simply translations of each other. For trellis coded quantizers, the granular gain defined in (37) uniquely determines the quantization performance if and only if the codebook $\mathcal{D}$ is infinitely uniform and the convolutional code $\mathcal{C}$ is of rate ½, i.e., $\mathcal{D} = \alpha \mathbf{Z} + \beta$ and $R = 1$, where $\alpha \in \mathbb{R}$ is called step size, and $\beta \in \mathbb{R}$ offset. For a simple uniform scalar quantizer (as a special case of trellis coded quantizer with $R=0$), $\mathcal{V}_0$ is an interval, thus the granular gain is 0 dB. As the dimensionality n goes to infinity, the maximum possible value of $g(\Lambda \mathcal{D}, \mathcal{C})$ is upper bounded by $$10 \log_{10} \frac{\pi e}{6} \approx 1.53 \text{ dB} [9].$$

To design a good trellis coded quantizer (with infinitely uniform codebook $\mathcal{D}$) in the sense of maximizing the granular gain, we need to design a good convolutional code $\mathcal{C}$, and thus a good pair of polynomials $(h_0, h_1)$. Unfortunately, the granular gain $g(\Lambda \mathcal{D}, \mathcal{C})$ is not a trivial function of $(h_0, h_1)$, and is normally evaluated by Monte Carlo simulations. If the number of states in $\mathcal{C}$ (hence the number of possible polynomials $h_0$ and $h_1$) is small (e.g., 4, 8), we can maximize the granular gain over all the possible $(h_0, h_1)$ using Monte Carlo simulations. However, as the number of states in $\mathcal{C}$ increases, the computational complexity of this full-search algorithm becomes astronomical.

1) Solution #1: maximize free distance.: One possible solution to simplify the full-search algorithm is to assume that the granular gain of a trellis coded quantizer is roughly a function of $d_{free}$ and $N_{d_{free}}$, where $d_{free}$ is the free distance of the vector codebook $\Lambda \mathcal{D}, \mathcal{C}$, defined as $d_{free} = \min\{\|y_1'' - y_2''\| : y_1'', y_2'' \in \Lambda \mathcal{D}, \mathcal{C}\}$; and $N_{d_{free}}$ is the number of code-vectors in $\Lambda \mathcal{D}, \mathcal{C}$ with a Euclidean distance of $d_{free}$ to the all-zero code-vector 0. This assumption is intuitively reasonable but lacks in accuracy. Nevertheless, it makes the searching algorithm tractable, since $d_{free}$ and $N_{d_{free}}$ can be easily computed without running simulations.

Table V (see FIG. 18) gives the optimized pairs of polynomials with four to 8,192 states and the granular gains of the corresponding trellis coded quantizers. Each pair of polynomials $(h_0, h_1)$ is optimized according to the following two criterions:

1) It has the largest free distance $d_{free}$ among all the polynomials with the same number of states. Note that we did not take into account the free distance among parallel transitions [33], which is always two times the quantization step size $\alpha$ (recall that $\mathcal{D}$ is partitioned into four cosets).
2) If two pairs have the same $d_{free}$, the one with smaller $N_{d_{free}}$ is preferred. If this criterion still cannot distinguish the two pairs, we check $N_{d_{free}+1}, N_{d_{free}+2}, \ldots, N_{d_{max}}$ until a decision is made. If all of them are equal, we choose the pair with smaller $h_0$.

Note that the optimal pairs of polynomials found in our simulations are not all the same as those in [33]. For comparison, we list the codes from [33] in brackets if they are different from ours.

2) Solution #2: list and simulate.: Although the pairs of polynomials in Table V (see FIG. 18) maximize $d_{free}$, there is no guarantee that they are the optimal pairs that maximize the granular gain. Searching for more powerful pairs of polynomials requires us to change the optimization criterions and directly maximize the granular gain; this necessitates the Monte Carlo simulations. To reduce the searching range, we first list the "potentially good" pairs of polynomials and pick (by Monte Carlo simulations) the best pair in the list that maximizes the granular gain.

First define the distance profile of a rate-½ convolutional code $\mathcal{C}$ as $$\rho(\mathcal{C}) = \sum_{j=j_{free}}^{\infty} N_j \cdot \wp^j, \quad (38)$$

where $j_{free} = d_{free}^2/\alpha^2$, and $N_j = \{y'' \in \Lambda \mathcal{D}, \mathcal{C} : \|y''\|^2 = j \cdot \alpha^2\}$. The distance profile $\rho(\mathcal{C})$ determines the shape of the basic Voronoi region $V_0$ to a great extent. Hence $\rho(\mathcal{C})$ is closely related to the granular gain of trellis coded quantizer, which is a function of the normalized second moment of $V_0$. To illustrate the relationship between $\rho(\mathcal{C})$ and $g(\Lambda \mathcal{D}, \mathcal{C})$, two different 256-state convolutional codes are compared in Table VI (see FIG. 19). We can see that $\mathcal{C}_2$ has a larger free distance $j_{free} = 17 > 15$, but $\mathcal{C}_1$ has a greater granular gain $g(\Lambda \mathcal{D}, \mathcal{C}) = 1.343 > 1.335$ dB. An intuitive explanation is that $\mathcal{C}_1$ produces much smaller $N_{17}, N_{18}, N_{20}$ and $N_{21}$, at the cost of slightly larger $N_{15}, N_{16}$ and $N_{19}$. Since normally, the larger the number of small distance vectors, the smaller the granular gain.

To quantitively incorporate this relationship into the design criterions, we define the accumulate distance profile of a convolutional code $\mathcal{C}$ as $$\pi(\mathcal{C}) = \sum_{j=j_{free}}^{\infty} \left[ \sum_{k=j_{free}}^{j} N_j \right] \cdot \mathfrak{W}^j = \sum_{j=j_{free}}^{\infty} M_j \cdot \mathfrak{W}^j, \quad (39)$$

and construct the list of "potentially good" pairs of polynomials in the following way:

1) Given the number of states for the convolutional code $\mathcal{C}$, we know the maximal free distance $d_{free}^{max}$. Let $j_{max} = (d_{free}^{max})^2/\alpha^2$.
2) Search for K pairs of polynomials with K smallest values of $M_j$, for $j^{max} - L \leq j \leq j^{max} + H$, producing a list of $(L+H+1)K$ "potentially good" pairs of polynomials.
3) Delete the repeated pairs, and output a list $\mathcal{L}$ of distinct pairs of polynomials.

Finally, we compute the granular gains of the trellis coded quantizers corresponding to each pair of polynomials in $\mathcal{L}$, and output the pair $(h_0, h_1)$ that maximizes the granular gain $g(\Lambda \mathcal{D}, \mathcal{C})$.

In one set of embodiments, we set $L=H=3$, while the value of K depends on the number of states (to control the total Monte Carlo simulation time). The optimized pairs of polynomials with four to 4,096 states are shown in Table VII (see FIG. 20), most of them are better than those in Table V (see FIG. 18).

C. Trellis Coded Vector Quantizer Design

Both optimization algorithms in solution #1 (to maximize $d_{free}$) and solution #2 (to maximize granular gain) are implemented, and the resulting two sets of optimized polynomials for 2-dimensional trellis coded vector quantizer and their corresponding granular gains are shown in Table VII (see FIG. 21). We can see that the second algorithm, which attempts to maximize the granular gain, produces a better set of polynomials with $g_{TCVQ}=1.280$ dB.

For 4-dimensional trellis coded vector quantizer, since the distance profile $\rho(\mathcal{C})$ is no longer independent of the code-vector, thus it is very difficult to design good set of polynomials using the above two criterions. In one set of embodiments, we run a simple random search algorithm, which computes the granular gain $g_{TCVQ}$ of randomly generated polynomials, and outputs the best set of polynomials after a certain number of Monte Carlo simulations. The best polynomials found in the simulations are shown in Table I (see FIG. 10).

IX. LDPC CODE DESIGN FOR WYNER-ZIV CODING

Define an LDPC degree profile P as a pair of vectors $(\lambda, \rho)$, where $$\lambda = \{\lambda_2, \lambda_3, \ldots, \lambda_{d_{lmax}}\}, \rho = \{\rho_2, \rho_3, \ldots, \rho_{d_{rmax}}\}, \quad (40)$$

such that $\sum_{i=2}^{d_{lmax}} \lambda_i = 1$ and $\sum_{j=2}^{d_{rmax}} \rho_j = 1$, $d_{lmax}$ is called the maximum left degree of P; $d_{rmax}$ the maximum right degree. Sometimes P is expressed by its generating functions $$\mathbb{P}(x, y) = (\lambda(x), \rho(y)) = \left(\sum_{i=2}^{d_{lmax}} \lambda_i x^{i-1}, \sum_{j=2}^{d_{rmax}} \rho_j y^{j-1}\right). \quad (41)$$

Each LDPC degree profile P defines an irregular LDPC code ensemble $\Omega(\mathbf{P})$ which includes all LDPC codes such that $\lambda_i$-fraction of the edges in the corresponding Tanner graph has left degree i ($2 \leq i \leq d_{lmax}$); and $\rho_j$-fraction of the edges has right degree j ($2 \leq i \leq d_{rmax}$). Hence the rate of all LDPC codes in $\Omega(\mathbf{P})$ can be computed as $$r(\mathbf{P}) = r(\lambda, \rho) = 1 - \frac{\int_0^1 \rho(y)dy}{\int_0^1 \lambda(x)dx} = 1 - \frac{\sum_{j=2}^{d_{rmax}} \frac{\rho_j}{j}}{\sum_{i=2}^{d_{lmax}} \frac{\lambda_i}{i}}. \quad (42)$$

We call $r(\mathbf{P})$ the rate of the LDPC degree profile P. Assuming all the LDPC codes in $\Omega(\mathbf{P})$ are cycle-free, then the LDPC degree profile P uniquely determines the decoding behavior of all codes in $\Omega(\mathbf{P})$.

A bit-LLR channel B→L is a channel whose input is a binary random variable B (corresponding to a bit-plane of the quantization indices), and whose output is a continuous valued random variable L (corresponding to the LLR computed at the decoder). The channel B→L is said to be symmetric if $p_L(l|B=1)=p_L(-l|B=0)$. FIG. 9 illustrates an example of the conditional distributions $p_{L|B}(l|B=0)$ and $p_{L|B}(l|B=1)$ of a bit-LLR channel B→L. Assume that B is a uniform source in the sense of P(B=1)=P(B=0)=0.5, which is true in our SWC-TCQ/TCVQ schemes since both the source distribution $p_X \sim N(0, \sigma_X^2)$ and the quantization codebook $\mathcal{D}$ are symmetric about the origin. Then the channel capacity of such a symmetric bit-LLR channel B→L with uniform input B can be computed as $$c(B \to L) = I(B, L) = h(L) - h(L|B) = -\int_{\mathbb{R}} f_L(l) \log_2(f_L(l))\,dl + \quad (43)$$

$$\sum_{i=0}^{1} P(B=i) \times \int_{\mathbb{R}} f_{L|B}(l|B=i) \log_2(f_{L|B}(l|B=i))\,dl$$

$$= \frac{1}{2} \sum_{i=0}^{1} \int_{\mathbb{R}} f_{L|B}(l|B=i) \log_2(f_{L|B}(l|B=i))\,dl - \quad (44)$$

$$\int_{\mathbb{R}} f_L(l) \log_2(f_L(l))\,dl.$$

Hence the minimum transmission rate for bit-plane B is H(B)−I(B, L)=1−c(B→L) b/s.

Fix a bit-LLR channel B→L, the LDPC code rate cannot exceed the channel capacity c(B→L), thus our goal is to make the rate r(P) of LDPC degree profile P as close as possible to its limit c(B→L) such that the decoding bit error rate vanishes after a certain number of iterations. The design procedure of good LDPC code profiles for a given bit-LLR channel B→L is based on the differential evolution algorithm [24], and is outlined in the following steps:

1) Generate a certain number of training blocks (e.g., 10 length-$10^6$ blocks) of source and side information samples according to the joint distribution $p_{X,Y}(x, y)$. Simulate the TCQ Encoder on source X (to obtain many samples of B) and the Trellis Path Estimator/Codeword Estimator (to obtain many samples of L). Compute the joint statistic n(B, L) to approximate the joint distribution $p_{B,L}(b, l)$.

2) Estimate the channel capacity c(B→L) by feeding $p_{B,L}(b, l)$ into (44). Let the estimated capacity be $r_{max}$. Also denote $P_0=\frac{1}{2}(p_{L|B}(l|B=0)+p_{L|B}(-l|B=1))$ as the PDF of L under the all-one codeword (all-zero input bits) assumption.

3) Decrease $r_{max}$ by a certain number $\in$, where $\in$ decreases as the block length n of the channel increases (e.g., $\in$=0.01 b/s for n=1,000,000). Let $r^0=r_{max}-\in$.

4) Fix a right degree profile $p^0$, and randomly generate N left degree profiles $\lambda_1^0, \lambda_2^0, \ldots, \lambda_N^0$, such that
   a) $r(\lambda_i^0, \rho^0)=r^0$ for $1 \leq i \leq N$;
   b) Each degree profile $(\lambda_i^0, \rho^0)$ satisfies the stability condition [26]:

$$\lambda'(0)\rho'(1) < \left(\int_{\mathbb{R}} P_0(l) e^{-\frac{l}{2}}\,dl\right)^{-1}, \quad (45)$$

where $$\lambda'(0) = \frac{d\lambda(x)}{dx}\bigg|_{x=0} = \lambda_2, \text{ and } \rho'(1) = \frac{d\rho(y)}{dy}\bigg|_{y=1} = \sum_{j=2}^{d_{\max}} (j-1)\rho_j.$$

The set of all these N degree profiles are called generation G=0.

5) Compute the residual bit error rate after $N_{iter}$ iterations for all N degree profiles using density evolution algorithm [26]. Denote the resulting bit error rate values as $(e_1^G, e_2^G, \ldots, e_N^G)$, and pick the minimum bit error rate $e_{best}^G = \min_{i=1}^N e_i^G$, which corresponds to the best left degree profile $\lambda_{best}^G$.

6) Mutate the G-th generation of degree profiles to obtain the next generation of N profiles according to the following mutation method: For each i=1, 2, ..., N, generate a new left degree profile $\lambda_i^{G+1}$ using $$\lambda_i^{G+1} = \lambda_{best}^G + F(\lambda_i^G - \lambda_j^G + \lambda_k^G - \lambda_m^G), \quad (46)$$

where F is a certain constant (e.g., F=0.5), and the five profiles on the right-hand-side must be distinct from each other. Repeatedly generate $\lambda_i^{G+1}$ until it is valid in the sense of having positive $\lambda_i^{G+1}$'s and satisfying (4a) and (4b).

7) Compute the residual bit error rate after $N_{iter}$ iterations for the new (G+1)-th generation of N degree profiles. Denote the resulting bit error rate values as $(e_1^{G+1}, e_2^{G+1}, \ldots, e_N^{G+1})$. Now for i=1, 2, ..., N, if $e_i^{G+1} > e_i^G$, then let $\lambda_i^{G+1} = \lambda_i^G$. Find the minimum bit error rate for the (G+1)-th generation $e_{best}^{G+1} + \min\{e_1^{G+1}, \ldots, e_N^{G+1}, e_{best}^G\}$, which corresponds to the best left degree profile $\lambda_{best}^{G+1}$.

8) Repeat steps (6) and (7), until $e_{best}^G$ is less than a certain value $e^{target}$ (e.g., $e^{target}=10^{-6}$) or $e_{best}^G$ does not change for some certain number of generations. If $e_{best}^G$ stops at a very large value (e.g., 0.01), which means the algorithm did not find a convergent degree profile, then disturb the right degree profile $\rho^0$ by a small amount and go back to step (4). If the algorithm still cannot find a convergent left degree profile, then further increase $\in$ and go back to step (3), until $e_{best}^G$ is less than $e^{target}$.

In one set of embodiments, we fix F=0.5, N=100, $e^{target}=10^{-6}$. $N_{iter}$ varies from 10 to 500, and $\in$ varies from 0.005 to 0.01, according to different channel capacities c(B→L). The resulting degree profiles for SWC-TCQ and SWC-TCVQ are shown in Table VIII (see FIG. 22) and Table IX (see FIG. 23), respectively. We can see that the rate loss for each bit-LLR channel is less than 0.01 b/s.

Using these degree profiles, parity check matrices can be randomly generated according to the corresponding node-perspective degree profiles. Then a full-search algorithm tries to find length-four cycles in the corresponding Tanner graph, and remove the cycles if possible. Normally, the removal of the length-four cycles becomes harder as the rate of the corresponding LDPC code decreases. However, at large block lengths (e.g., 1,000,000), these short cycles will not affect the decoding performance (in terms of bit error rate) very much.

REFERENCES

[1] A. Aaron and B. Girod, "Compression with side information using turbo codes," Proc. DCC '02, pp. 252-261, Snowbird, Utah, March 2002.

[2] L. Bahl, J. Cocke, F. Jelinek, and J. Raviv. "Optimal decoding of linear codes for minimizing symbol error rate," IEEE Trans. Inform. Theory, vol. 20, pp. 284-287, March 1974.

[3] T. Berger, "Multiterminal source coding," in The Information Theory Approach to Communications, G. Longo, Ed., New York: Springer-Verlag, 1977.

[4] C. Berrou and A. Glavieux, "Near optimum error correcting coding and decoding: turbo-codes," IEEE Trans. Communications, vol. 44, pp. 1261-1271, October 1996.

[5] S. Cheng and Z. Xiong, "Successive refinement for the Wyner-Ziv problem and layered code design," IEEE Trans. Signal Processing, vol. 53, pp. 3269-3281, August 2005.

[6] J. Chou, S. Pradhan, and K. Ramchandran, "Turbo and trellis-based constructions for source coding with side information," Proc. DCC '03, pp. 33-42, Snowbird, Utah, March 2003.

[7] M. Costa, "Writing on dirty paper," IEEE Trans. Info. Theory, vol. 29, pp. 439-441, May 1983.

[8] T. Cover and J. Thomas, Element of information theory, New York: Wiley, 1991.

[9] J. Conway and J. Sloane, Sphere Packings. Lattices and Groups, Springer, New York, 1998.

[10] U. Erez and S. ten Brink, "A close-to-capacity dirty paper coding scheme," IEEE Trans. Info. Theory, vol. 51, pp. 3417-3432, October 2005.

[11] T. Fischer, M. Marcellin, and M. Wang, "Trellis coded vector quantization," IEEE Trans. Inform. Theory, vol. 37, pp. 1551-1566, November 1991.

[12] T. Fischer and M. Wang, "Entropy-constrained trellis coded quantization," IEEE Trans. Inform. Theory, vol. 38, pp. 415-426, March 1992.

[13] M. Eyuboglu and D. Forney, "Lattice and trellis quantization with lattice- and trellis-bounded codebooks-High-rate theory for memoryless sources," IEEE Trans. Inform. Theory, vol. 39, pp. 46-59, January 1993.

[14] J. Garcia-Frias and Y. Zhao, "Compression of correlated binary sources using turbo codes," IEEE Comm. Letters, vol. 5, pp. 417-419, October 2001.

[15] R. Gray and D. Neuhoff, "Quantization," IEEE Trans. Inform. Theory, vol. 44, pp. 2325-2383, October 1998.

[16] Z. Liu, S. Cheng, A. Liveris, and Z. Xiong, "Slepian-Wolf coded nested lattice quantization for Wyner-Ziv coding: High-rate performance analysis and code design," Available at http://lena.tamu.edu/papers/SWCNQ.pdf (also in "Slepian-Wolf coded nested quantization (SWC-NQ) for Wyner-Ziv coding: Performance analysis and code design", Proc. DCC '04, pp. 322-331, Snowbird, Utah, March 2004.)

[17] A. Liveris, Z. Xiong and C. Georghiades, "Compression of binary sources with side information at the decoder using LDPC codes," IEEE Communications Letters, vol. 6, pp. 440-442, October 2002.

[18] A. Liveris, Z. Xiong, and C. Georghiades, "Nested convolutional/turbo codes for the binary Wyner-Ziv problem," Proc. ICIP '03, pp. 601-604, Barcelona, Spain, September 2003.

[19] M. Marcellin and T. Fischer, "Trellis coded quantization of memoryless and Gaussian-Markov sources," IEEE Trans. Communications, vol. 38, pp. 82-93, January 1990.

[20] M. Marcellin, "On entropy-constrained trellis coded quantization," IEEE Trans. Communications, vol. 42, pp. 14-16, January 1994.

[21] D. MacKay, "Good error-correcting codes based on very sparse matrices," IEEE Trans. Inform. Theory, vol. 45, pp. 399-431, March 1999.

[22] S. Pradhan, J. Chou, and K. Ramchandran, "Duality between source coding and channel coding and its extension to the side information case," *IEEE Trans. Inform. Theory*, vol. 49, pp. 1181-1203, May 2003.

[23] S. Pradhan and K. Ramchandran, "Distributed source coding using syndromes (DISCUS): Design and construction," *IEEE Trans. Inform. Theory*, vol. 49, pp. 626-643, March 2003.

[24] K. Price and R. Storn, "Differential evolution—A simple and efficient heuristic for global optimization over continuous spaces," *J. Global Optimiz.*, vol. 11, pp. 341-359, 1997.

[25] T. Richardson and R. Urbanke, "The capacity of low-density parity-check codes," *IEEE Trans. Inform. Theory*, vol. 47, pp. 599-618, February 2001.

[26] T. Richardson, M. Shokrollahi, and R. Urbanke, "Design of capacity-approaching irregular low-density parity-check codes", *IEEE Trans. Inform. Theory*, vol. 47, pp. 619-637, February 2001.

[27] D. Rebollo-Monedero, R. Zhang, and B. Girod, "Design of optimal quantizers for distributed source coding," Proc. DCC '03, pp. 13-22, Snowbird, Utah, March 2003.

[28] D. Slepian and J. Wolf, "Noiseless coding of correlated information sources," *IEEE Trans. Inform. Theory*, vol. 19, pp. 471-480, July 1973.

[29] V. Stanković, A. Host-Madsen, and Z. Xiong, "Cooperative diversity for wireless ad hoc networks: Capacity bounds and code designs," http://lena.tamu.edu/papers/SPM.pdf; also to appear in *IEEE Signal Processing Magazine*, vol. 22, September 2006.

[30] Y. Sun, A. Liveris, V. Stanković, and Z. Xiong, "Near-capacity dirty-paper code designs based on TCQ and IRA codes," Proc. ISIT '05, Adelaide, Australia, September 2005.

[31] D. Taubman and M. Marcellin, *JPEG2000: Image Compression Fundamentals, Standards, and Practice*, Kluwer, 2001.

[32] S. ten Brink, "Convergence behavior of iteratively decoded parallel concatenated codes", *IEEE Trans. Communications*, vol. 49, pp. 1727-1737, October 2001.

[33] G. Ungerboeck, "Channel coding with multilevel/phase signals," *IEEE Trans. Inform. Theory*, vol. 28, pp. 55-67, January 1982.

[34] G. Ungerboeck, "Trellis-coded modulation with redundant signal sets," *IEEE Communications Magazine*, vol. 25, pp. 5-21, February 1987.

[35] X. Wang, and M. Orchard, "Design of trellis codes for source coding with side information at the decoder," Proc. DCC '01, pp. 361-370, Snowbird, Utah, March 2001.

[36] A. Wyner, "Recent results in the Shannon theory," *IEEE Trans. Inform. Theory*, pp. 2-10, January 1974.

[37] A. Wyner and J. Ziv, "The rate-distortion function for source coding with side information at the decoder," *IEEE Trans. Inform. Theory*, vol. 22, pp. 1-10, January 1976.

[38] A. Wyner, "The rate-distortion function for source coding with side information at the decoder-II: general sources," *Inform. Contr.*, vol. 38, pp. 60-80, 1978.

[39] Z. Xiong, A. Liveris, and S. Cheng, "Distributed source coding for sensor networks," *IEEE Signal Processing Magazine*, vol. 21, pp. 80-94, September 2004.

[40] Q. Xu and Z. Xiong, "Layered Wyner-Ziv video coding," *IEEE Trans. Image Processing*, to appear.

[41] Y. Yang, S. Cheng, Z. Xiong, and W. Zhao, "Wyner-Ziv coding based on TCQ and LDPC codes," Proc. 37th Asilomar Conference on Signals, Systems, and Computers, pp. 825-829, Pacific Grove, CA, November 2003.

[42] R. Zamir, "The rate loss in the Wyner-Ziv problem," *IEEE Trans. Inform. Theory*, vol. 42, pp. 2073-2084, November 1996.

[43] R. Zamir and S. Shamai, "Nested linear/lattice codes for Wyner-Ziv encoding," Proc. ITW '98, pp. 92-93, Killarney, Ireland, June 1998.

[44] R. Zamir, S. Shamai, and U. Erez, "Nested linear/lattice codes for structured multiterminal binning," *IEEE Trans. Inform. Theory*, vol. 48, pp. 1250-1276, June 2002.

The invention claimed is:

1. A method comprising:
    performing trellis coded quantization (TCQ) on a block of samples of a source to obtain a block of quantization indices, wherein polynomials of the TCQ are selected to maximize granular gain;
    compressing bit planes of the block of quantization indices using parity check matrices of corresponding low-density parity check (LDPC) codes to obtain corresponding syndromes;
    transmitting the syndromes onto a channel.

2. The method of claim 1, wherein a number of states of the TCQ is greater than 256.

3. The method of claim 1, wherein each of the parity check matrices is selected to minimize bit error rate for the corresponding bit plane.

4. The method of claim 1, where each of the bit planes is compressed at a rate that approaches close to the limit for Slepian-Wolf coding.

5. The method of claim 1, wherein said performing TCQ includes a number of stages, wherein at least one of the stages is performed in a parallel fashion.

6. The method of claim 1, wherein the source is a continuous source, wherein the syndromes are digital data.

7. A method comprising:
    receiving a set of syndromes from a channel, wherein the set of syndromes are generated by an encoder configured to:
        perform trellis coded quantization (TCQ) on a block of samples of a source to obtain a block of quantization indices, wherein polynomials of the TCQ are selected to maximize granular gain; and
        compress bit planes of the block of quantization indices using parity check matrices of corresponding low-density parity check (LDPC) codes to obtain corresponding ones of the syndromes;
    decoding the syndromes, using side information, to obtain an estimate of the block of quantization indices;
    generating an estimate for the block of source samples using the estimate of the block of quantization indices and the side information.

8. The method of claim 7, wherein said decoding the syndromes includes performing an iterative message passing algorithm.

9. The method of claim 7, wherein the side information is correlated with the source, wherein the estimate for the block of source samples is digital data.

10. The method of claim 7, wherein said decoding the syndromes includes performing a number of successive decoding stages, wherein the decoding stages include a first subset, wherein each decoding stage of the first subset decodes a corresponding bit plane of the syndromes using the side information and one or more decoded bit planes generated by one or more previous ones of the decoding stages.

11. The method of claim 7, wherein said generating an estimate for the block of source samples is performed using a nonlinear minimum mean-squared-error estimator.

12. A method comprising:
- performing trellis coded vector quantization (TCVQ) on a block of samples of a source to obtain a block of quantization indices, wherein polynomials of the TCVQ are selected to maximize granular gain;
- compressing bit planes of the block of quantization indices using parity check matrices of corresponding low-density parity check (LDPC) codes to obtain corresponding syndromes;
- transmitting the syndromes onto a channel.

13. The method of claim 12, wherein the source is a continuous source, wherein the syndromes are digital data.

14. The method of claim 12, wherein at least one of the parity check matrices is optimized to minimize bit error rate for the corresponding bit plane.

15. The method of claim 12, wherein a first of the bit planes is compressed at a rate that approaches close to the limit for Slepian-Wolf coding for the first bit plane.

16. A method comprising:
- receiving a set of syndromes from a channel, wherein the set of syndromes are generated by an encoder configured to:
  - perform trellis coded vector quantization (TCVQ) on a block of samples of a source to obtain a block of quantization indices, wherein polynomials of the TCVQ are selected to maximize granular gain; and
  - compress bit planes of the block of quantization indices using parity check matrices of corresponding low density parity check (LDPC) codes to obtain corresponding ones of the syndromes;
- decoding the syndromes, using side information, to obtain an estimate of the block of quantization indices; and
- generating an estimate for the block of source samples using the estimate of the block of quantization indices and the side information.

17. The method of claim 16, wherein said decoding the syndromes includes performing an iterative message passing algorithm.

18. The method of claim 16, wherein the side information is correlated with the source, wherein the estimate for the block of source samples is digital data.

19. The method of claim 16, wherein said decoding the syndromes includes performing a number of successive decoding stages, wherein the decoding stages include a first subset, wherein each decoding stage of the first subset decodes a corresponding bit plane of the syndromes using the side information and one or more decoded bit planes generated by one or more previous ones of the decoding stages.

20. The method of claim 16, wherein said generating an estimate for the block of source samples is performed using a nonlinear minimum mean-squared-error estimator.

21. A system comprising:
- a trellis coded quantization unit configured to perform trellis coded quantization (TCQ) on a block of samples of a source to obtain a block of quantization indices, wherein polynomials of the TCQ are selected to increase granular gain;
- a compression unit configured to compress bit planes of the block of quantization indices using parity check matrices of corresponding low-density parity check (LDPC) codes to obtain corresponding syndromes; and
- a transmitter configured to transmit the syndromes onto a channel.

22. A system comprising:
- a first means for performing trellis coded quantization (TCQ) on a block of samples of a source to obtain a block of quantization indices, wherein polynomials of the TCQ are optimized to maximize granular gain;
- a second means for compressing bit planes of the block of quantization indices using parity check matrices of corresponding low-density parity check (LDPC) codes to obtain corresponding syndromes; and
- a transmitter configured to transmit the syndromes onto a channel.

23. A system comprising:
- a decoder unit configured to receive a set of syndromes from a channel, wherein the set of syndromes are generated by an encoder configured to:
  (a) perform trellis coded quantization (TCQ) on a block of samples of a source to obtain a block of quantization indices, wherein polynomials of the TCQ are optimized to maximize granular gain, and
  (b) compress bit planes of the block of quantization indices using parity check matrices of corresponding low-density parity check (LDPC) codes to obtain corresponding ones of the syndromes, wherein the decoder unit is further configured to decode the syndromes, using side information, to obtain an estimate of the block of quantization indices; and
- an estimation unit configured to generate an estimate for the block of source samples using the estimate of the block of quantization indices and the side information.

24. The system of claim 23, wherein the estimation unit configured to generate the estimate based on a nonlinear estimation method.

25. A system comprising:
- first means for decoding received syndromes, using side information, to obtain a block of first quantization indices, wherein the syndromes have been generated by an encoder configured to:
  (a) perform trellis-based quantization on a block of source samples to obtain a block of second quantization indices, wherein polynomials of the trellis-based quantization are optimized to maximize granular gain, and
  (b) compress bit planes of the block of second quantization indices using parity check matrices of corresponding low-density parity check (LDPC) codes to obtain corresponding ones of the syndromes; and
- second means for generating an estimate for the block of source samples using the block of first quantization indices and the side information.

26. The system of claim 25, wherein the trellis-based quantization is trellis coded quantization (TCQ).

27. The system of claim 25, wherein the trellis-based quantization is trellis-coded vector quantization (TCVQ).

28. The system of claim 25, wherein the second means is a means for generating an nonlinear estimate for the block of source samples using the block of first quantization indices and the side information.

29. A system comprising:
- a trellis coded vector quantization unit configured to perform trellis coded vector quantization (TCVQ) on a block of samples of a source to obtain a block of quantization indices, wherein polynomials of the TCVQ are selected to increase granular gain;
- a compression unit configured to compress bit planes of the block of quantization indices using parity check matrices of corresponding low-density parity check (LDPC) codes to obtain corresponding syndromes; and
- a transmitter configured to transmit the syndromes onto a channel.

30. A system comprising:
a first means for performing trellis coded vector quantization (TCVQ) on a block of samples of a source to obtain a block of quantization indices, wherein polynomials of the TCVQ are optimized to maximize granular gain; and
a second means for compressing bit planes of the block of quantization indices using parity check matrices of corresponding low-density parity check (LDPC) codes to obtain corresponding syndromes; and
a transmitter configured to transmit the syndromes onto a channel.

31. A system comprising:
a decoder unit configured to receive a set of syndromes from a channel, wherein the set of syndromes are generated by an encoder configured to:
(a) perform trellis coded vector quantization (TCVQ) on a block of samples of a source to obtain a block of quantization indices, wherein polynomials of the TCVQ are optimized to maximize granular gain, and
(b) compress bit planes of the block of quantization indices using parity check matrices of corresponding low density parity check (LDPC) codes to obtain corresponding ones of the syndromes, wherein the decoder is further configured to decode the syndromes, using side information, to obtain an estimate of the block of quantization indices; and
an estimation unit configured to generate an estimate for the block of source samples using the estimate of the block of quantization indices and the side information.

32. The system of claim 31, wherein the estimation unit is configured to generate the estimate based on a nonlinear estimation method.

33. A computer-implemented method comprising:
(a) generating a right degree profile for a low-density parity check (LDPC) encoder;
(b) generating a set of left degree profiles for the LDPC encoder, wherein the set of left degree profiles satisfy a stability condition and have a rate approximately equal to r0, wherein r0 is less than a capacity of a virtual channel between a bit plane of a block of trellis-coded quantization indices and a block of samples of side information;
(c) repeatedly updating the set of left degree profiles using density evolution and differential evolution until a smallest of bit error rates corresponding to the left degree profiles of the set satisfies a first termination condition;
(d) disturbing the right degree profile and repeating (b) and (c) if the smallest of the bit error rates is larger than a target bit error rate; and
(e) storing the right degree profile and the left degree profile $L_S$ of said set having the smallest bit error rate in a memory, wherein the right degree profile and the left degree profile $L_S$ specify the structure of a final LDPC encoder.

34. The method of claim 33 further comprising:
storing the right degree profile and the left degree profile of said set having the smallest bit error rate in a memory of an encoder device or a memory of a decoder device.

35. The method of claim 33 further comprising:
after performing (a) through (d) and prior to performing (e), determining that the smallest of the bit error rates, corresponding to the left degree profiles of said set, is larger than the target bit error rate; and
decreasing the rate r0 and repeating (a) through (d) in response to said determination that the smallest of the bit error rates is larger than the target bit error rate.

36. A method for selecting a single pair of polynomials for specifying the structure of a trellis coded quantization (TCQ) encoder, the method comprising:
searching a space of polynomial pairs to determine one or more polynomial pairs in the space that maximize the free Euclidean distance dfree of a vector codebook of a trellis coded quantization;
determining that the one or more polynomial pairs include a set of two or more polynomial pairs corresponding to the same value of dfree and the same value of N(dfree), wherein N(x), for a given polynomial pair, is the number of code vectors, in the vector codebook of the trellis coded quantization corresponding to the given polynomial pair, with a Euclidean distance of x to the all-zero code vector; and
selecting a single pair of polynomials from said set by performing one or more iterations, wherein, in each iteration, N(dfree+k) is computed for each of the polynomial pairs remaining in the set and only those polynomial pairs minimizing N(dfree+k) are retained in said set, and wherein successive ones of the one or more iterations correspond to successive values of the positive integer k;
wherein the single polynomial pair specifies the structure of the TCQ encoder.

37. The method of claim 36, wherein successive ones of said one or more iterations are performed until a maximum value of the index k is attained or until the number of the remaining polynomial pairs in the set equals one.

38. The method of claim 36 further comprising:
storing the single polynomial pair in a memory of a TCQ encoder or in a memory of a TCQ decoder.

39. A method comprising:
estimating a maximum of the free Euclidean distance of a vector codebook, corresponding to a trellis coded quantization (TCQ) having a given number of states, over a set of convolutional codes;
computing an index value jmax based on the estimated maximum free Euclidean distance;
determining, for each value of an index j in an index range including the index value jmax, a set $S_j$ containing K pairs of polynomials having the K smallest values of $M_j$, wherein the value of $M_j$ for a given polynomial pair is the $j^{th}$ coefficient of an accumulate distance profile of a convolutional code defined by the given polynomial pair, wherein K is a positive integer;
computing a granular gain for each pair of polynomials in the union S of the sets $S_j$;
determining a single pair of polynomials, from the union S, that maximizes the granular gain, wherein the single pair of polynomials defines the structure of a TCQ encoder.

40. The method of claim 39 further comprising:
storing the single pair of polynomials in a memory of a TCQ encoder or the memory of a TCM decoder.

* * * * *